US010152180B2

(12) United States Patent
Chang et al.

(10) Patent No.: US 10,152,180 B2
(45) Date of Patent: Dec. 11, 2018

(54) CHIP SCALE SENSING CHIP PACKAGE AND A MANUFACTURING METHOD THEREOF

(71) Applicant: XINTEC INC., Taoyuan (TW)

(72) Inventors: Shu-Ming Chang, New Taipei (TW); Yu-Lung Huang, Taoyuan (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 250 days.

(21) Appl. No.: 15/061,858

(22) Filed: Mar. 4, 2016

(65) Prior Publication Data
US 2016/0266680 A1 Sep. 15, 2016

Related U.S. Application Data

(60) Provisional application No. 62/131,129, filed on Mar. 10, 2015.

(51) Int. Cl.
G06F 3/044 (2006.01)
H01L 21/683 (2006.01)
H01L 21/768 (2006.01)
G06K 9/00 (2006.01)
(Continued)

(52) U.S. Cl.
CPC ......... *G06F 3/044* (2013.01); *G06K 9/00006* (2013.01); *H01L 21/6835* (2013.01); *H01L 21/76898* (2013.01); *H01L 23/481* (2013.01); *G06F 2203/04103* (2013.01);
(Continued)

(58) Field of Classification Search
None
See application file for complete search history.

(56) References Cited

U.S. PATENT DOCUMENTS 3,770,482 A * 11/1973 Millar .................. B05D 1/06
427/470
5,444,301 A  8/1995 Song et al.
(Continued)

FOREIGN PATENT DOCUMENTS

CN  1305120  7/2001
CN  1839473  9/2006
(Continued)

*Primary Examiner* — Lex Malsawma
(74) *Attorney, Agent, or Firm* — Liu & Liu

(57) ABSTRACT

This present invention provides a chip scale sensing chip package, comprising a sensing chip having a first top surface and a first bottom surface opposite to each other, a touch plate having a second top surface and a second bottom surface opposite to each other, formed above the sensing chip, and a color layer, sandwiched between the sensing chip and the touch plate, wherein the sensing chip comprises a sensing device formed nearby the first top surface and a plurality of conductive pads formed nearby the first top surface and adjacent to the sensing device, a plurality of through silicon vias exposing their corresponding conductive pads formed on the first bottom surface, a plurality of conductive structures formed on the first bottom surface, and a re-distribution layer overlaying the first bottom surface and each through silicon via to electrically connect each conductive pad and each conductive structure.

28 Claims, 18 Drawing Sheets

(51) Int. Cl.
  *H01L 23/48* (2006.01)
  *H01L 23/31* (2006.01)
(52) U.S. Cl.
  CPC . *H01L 23/3114* (2013.01); *H01L 2221/68327* (2013.01); *H01L 2224/11* (2013.01)

(56) References Cited

U.S. PATENT DOCUMENTS

| | | | | |
|---|---|---|---|---|
| 6,864,172 | B2* | 3/2005 | Noma | H01L 21/6836 257/E21.508 |
| 7,535,097 | B2* | 5/2009 | Kojima | B81B 7/007 257/433 |
| 7,851,880 | B2* | 12/2010 | Suzuki | H01L 23/481 257/433 |
| 7,994,547 | B2* | 8/2011 | Benson | H01L 21/76898 257/258 |
| 8,692,358 | B2* | 4/2014 | Huang | H01L 27/14618 257/432 |
| 2005/0056903 | A1* | 3/2005 | Yamamoto | H01L 21/76898 257/433 |
| 2007/0235882 | A1* | 10/2007 | Sekiguchi | H01L 21/568 257/777 |
| 2009/0289318 | A1* | 11/2009 | Lin | H01L 27/14618 257/433 |
| 2010/0123681 | A1* | 5/2010 | Wu | G06F 3/045 345/174 |
| 2011/0079903 | A1* | 4/2011 | Liu | H01L 24/03 257/738 |
| 2015/0331508 | A1* | 11/2015 | Nho | G06F 3/0421 345/173 |

FOREIGN PATENT DOCUMENTS

| | | |
|---|---|---|
| CN | 101919057 | 12/2010 |
| CN | 102034778 | 4/2011 |

* cited by examiner

CHIP SCALE SENSING CHIP PACKAGE AND A MANUFACTURING METHOD THEREOF

This application claims the benefit of U.S. provisional application No. 62/131,129, filed on Mar. 10, 2015, and the entirety of which is incorporated by reference herein.

BACKGROUND OF THE INVENTION

Field of the Invention

The present invention relates to a sensing chip package, and in particular relates to a chip scale sensing chip package and a manufacturing method thereof.

Description of the Related Art

A conventional chip package having sensing functions, such as a fingerprint-recognition chip package, is easily contaminated or damaged during the manufacturing processes which results in decreasing both the yield and liability of conventional chip package having sensing functions. In order to meet the tendency of size-miniaturization of electronic components, it is an import subject to minimize the thickness of a substrate for carrying a semiconductor chip to be packaged. However, if a thin substrate for carrying a semiconductor chip to be packaged is utilized, the yield will be reduced owing to the thin substrate is bended or damaged during the package process.

Moreover, the touch panel or the panel having sensing functions, for example biometric identification, are current trends of technology. However, the touch devices are easily out of orders owing to frequently pressing onto the panel by users. In order to resolve abovementioned defects, a scratch-resistant material having a hardness higher than 9, for example sapphire, is selected as the touch pad of the touch panel to protect the semiconductor devices under the touch panel. Currently, the sapphire substrate used to protect the touch devices or biometric sensing devices has a thickness about 200 μm, and the signals of the touch panel or the sensing panel with biometric identification functions are transmitted by the change of touch pad's capacitance. The capacitance of a parallel plate capacitor is well-known as following formula: $C=\varepsilon *A/d$, wherein C is the capacitance of a parallel plate capacitor, $\varepsilon$ is the capacitance permittivity of the dielectric material between parallel plates, A is the area of overlap of parallel plates, and d is the distance between the plates. As the capacitance formula of a parallel plate shown, the capacitance is inversely proportional to the distance between the parallel plates when $\varepsilon$ and A keep constant. Therefore, the increase of thickness of parallel plates will result in increase of d which leads to decrease of C.

In order to resolve above-mentioned disadvantages and enhance the sensitivity of the capacitive touch panel having sensing functions, this present invention discloses a novel chip scale sensing chip package and a manufacturing method thereof. This present invention is achieved by using a touch plate with a hardness higher than 7 and reducing its thickness to enhance the capacitance of the capacitive touch panel having sensing functions.

Moreover, this present invention is achieved by so-called wafer level package processes, which can not only precisely place the thin touch pad on the sensing chip, but also decrease the thickness of the adhesive sandwiched between the touch plate wafer and the wafer with sensing devices by means of spin coating. Therefore, a high-K material for increasing the capacitance is not necessary and can be replaced by medium-K or low-K materials. Accordingly, the production costs can be reduced, and a chip scale sensing chip package module with higher efficiency are provided. Moreover, the mismatch of the sensing chip and the touch pad occurring in the conventional technology can be avoided because the touch pad and the chip are of the same chip scale by bonding the touch pad to the sensing chip during the semiconductor process.

SUMMARY OF THE INVENTION

A feature of this invention provides a chip scale sensing chip package, comprising a sensing chip having a first top surface and a first bottom surface opposite to each other, a touch plate having a second top surface and a second bottom surface opposite to each other, formed above the sensing chip, and a color layer, sandwiched between the sensing chip and the touch plate, wherein the sensing chip comprises a sensing device formed nearby the first top surface and a plurality of conductive pads formed nearby the first top surface and adjacent to the sensing device, a plurality of through silicon vias exposing their corresponding conductive pads formed on the first bottom surface, a plurality of conductive structures formed on the first bottom surface, and a re-distribution layer overlaying the first bottom surface and each through silicon via to electrically connect each conductive pad and each conductive structure.

Another feature of this invention provides a chip scale sensing chip package as mentioned above, further comprising an adhesive layer sandwiched between the sensing chip and the color layer or mixed within the color layer.

Another feature of this invention provides a chip scale sensing chip package as mentioned above, wherein the adhesive layer comprises a material consisted of medium-K or low-K dielectric materials.

Another feature of this invention provides a chip scale sensing chip package as mentioned above, wherein the touch plate and the sensing chip are of the same size.

Another feature of this invention provides a chip scale sensing chip package as mentioned above, wherein the top-viewing profiles of the touch plate and the sensing chip are rectangular.

Another feature of this invention provides a chip scale sensing chip package as mentioned above, wherein the touch plate comprises the material selected from one or more members of the group consisted of glass, sapphire, aluminum nitride and ceramic materials.

Another feature of this invention provides a chip scale sensing chip package as mentioned above, wherein the cross-sectional area of each through silicon via increases from the first top surface to the first bottom surface.

Another feature of this invention provides a chip scale sensing chip package as mentioned above, wherein the conductive structures comprise solder balls, solder bumps and conductive pillars.

Another feature of this invention provides a method of manufacturing a chip scale sensing chip package, comprising the steps of: providing a sensing device wafer, having a first top surface and a first bottom surface opposite to each other, wherein the sensing chip wafer comprises a plurality of chip areas, and each chip area has a sensing device formed nearby the first top surface and a plurality of conductive pads formed nearby the first top surface and adjacent to the sensing device; providing a touch plate wafer with a plurality of touch plates areas, wherein each touch plate area corresponds to each sensing chip area, and each touch plate has a second top surface and a second bottom surface opposite to each other; spin-coating a color layer on the first top surface of the sensing device wafer or the second bottom surface of the touch plate wafer; joining the sensing device wafer with the touch plate wafer to form a stacking structure, wherein the color is sandwiched between the sensing device wafer and the touch plate wafer; thinning the first bottom surface of the sensing device wafer to form a third bottom surface with a thickness thinner than that of the first bottom surface; forming a plurality of first through silicon vias on the third bottom surface, wherein each first through silicon via has a side-wall exposes the edge of each conductive pad; forming an insulating layer on the third bottom surface, the side-wall of each first through silicon via and the edge of each conductive pad, wherein the insulating layer has a plurality of second through silicon vias exposes each conductive pad, and each second through silicon via runs through each first through silicon via; forming a re-distributed layer on the insulating layer to electrically connect to each conductive pad through each second through silicon via; forming a passivation layer on the re-distributed layer, having a plurality of third through silicon vias exposing the re-distributed layer; forming a plurality of conductive structures in the third through silicon vias, and each third through silicon via electrically connected to the re-distributed layer; and scribing the chip areas and the touch plate areas corresponding to the chip areas to generate a plurality of individual chip scale sensing chip package.

Another feature of this invention provides a method of manufacturing a chip scale sensing chip package as mentioned above, further comprising a step of forming an adhesive layer by spin-coating sandwiched between the sensing device wafer and the color layer or on the second bottom surface of the touch plate wafer or mixed within the color layer.

Another feature of this invention provides a method of manufacturing a chip scale sensing chip package as mentioned above, wherein the adhesive layer comprises a material consisted of medium-K or low-K dielectric materials.

Another feature of this invention provides a method of manufacturing a chip scale sensing chip package as mentioned above, wherein the touch plate and the sensing chip are of the same size.

Another feature of this invention provides a method of manufacturing a chip scale sensing chip package as mentioned above, wherein the top-viewing profiles of the touch plate and the sensing chip are rectangular.

Another feature of this invention provides a method of manufacturing a chip scale sensing chip package as mentioned above, wherein the touch plate comprises the material selected from one or more members of the group consisted of glass, sapphire, aluminum nitride and ceramic materials.

Another feature of this invention provides a method of manufacturing a chip scale sensing chip package as mentioned above, wherein the cross-sectional area of each through silicon via increases from the first top surface to the first bottom surface.

Another feature of this invention provides a method of manufacturing a chip scale sensing chip package as mentioned above, wherein the conductive structures comprise solder balls, solder bumps and conductive pillars.

Another feature of this invention provides a method of manufacturing a chip scale sensing chip package as mentioned above, wherein the touch plate wafer is formed on a temporary substrate, and the temporary is removed after the step of scribing to generate a plurality of individual chip scale sensing chip packages.

Another feature of this invention provides a chip scale sensing chip package, comprising a sensing chip having a first top surface, an opposite first bottom surface, and a first sidewall and a second sidewall respectively adjoined to the first top surface and the first bottom surface, a touch plate having a second top surface and a second bottom surface opposite to each other, formed above the sensing chip; and a color layer, sandwiched between the sensing chip and the touch plate. The sensing chip comprises a sensing device formed nearby the first top surface, a plurality of conductive pads formed nearby the first top surface and adjacent to the sensing device, wherein the first side wall and the second side wall respectively exposes the edge of each conductive pad, a plurality of conductive structures formed on the first bottom surface, and a re-distribution layer overlaying the first bottom surface and the first, second side walls to electrically connect each conductive pad and each conductive structure.

Another feature of this invention provides a chip scale sensing chip package as mentioned above, further comprising an adhesive layer sandwiched between the sensing chip and the color layer or mixed within the color layer.

Another feature of this invention provides a chip scale sensing chip package as mentioned above, wherein the adhesive layer comprises a material consisted of medium-K or low-K dielectric materials.

Another feature of this invention provides a chip scale sensing chip package as mentioned above, wherein the touch plate and the sensing chip are of the same size.

Another feature of this invention provides a chip scale sensing chip package as mentioned above, wherein the top-viewing profiles of the touch plate and the sensing chip are rectangular.

Another feature of this invention provides a chip scale sensing chip package as mentioned above, wherein the touch plate comprises the material selected from one or more members of the group consisted of glass, sapphire, aluminum nitride and ceramic materials.

Another feature of this invention provides a chip scale sensing chip package as mentioned above, wherein the conductive structures comprise solder balls, solder bumps and conductive pillars.

Another feature of this invention provides a method of manufacturing a chip scale sensing chip package, comprising the steps of providing a sensing device wafer, having a first top surface and a first bottom surface opposite to each other, wherein the sensing chip wafer comprises a plurality of chip areas, and each chip area has a sensing device formed nearby the first top surface and a plurality of conductive pads formed nearby the first top surface and adjacent to the sensing device; providing a touch plate wafer with a plurality of touch plates areas, wherein each touch plate area corresponds to each sensing chip area, and each touch plate has a second top surface and a second bottom surface opposite to each other; spin-coating a color layer on the first top surface of the sensing device wafer or the second bottom surface of the touch plate wafer; joining the sensing device wafer with the touch plate wafer to form a stacking structure, wherein the color is sandwiched between the sensing device wafer and the touch plate wafer; thinning the first bottom surface of the sensing device wafer to form a third bottom surface with a thickness thinner than that of the first bottom surface; forming a plurality of fourth through silicon vias running through the third bottom surface and the first top surface; forming an insulating layer on the third bottom surface and the fourth through silicon vias; removing the insulating layer adjacent to the fourth through silicon vias, part of the color layer and part of the conductive pads to form a plurality of notch, wherein each notch has a bottom wall, a first side wall and a second wall extended upward from the edges of the bottom wall of each notch, and each first side wall and each second wall exposes the edge of each conductive pad; forming a re-distributed layer on the insulating layer and overlaying the first side wall, the second side wall and the bottom to electrically connect to the exposed edge of each conductive pad on the first side wall and the second side wall; forming a passivation layer on the re-distributed layer, having a plurality of fifth through silicon vias exposing the re-distributed layer; forming a plurality of conductive structures in the fifth through silicon vias, and each fifth through silicon via electrically connected to the re-distributed layer; and scribing the chip areas and the touch plate areas corresponding to the chip areas to generate a plurality of individual chip scale sensing chip package.

Another feature of this invention provides a method of manufacturing a chip scale sensing chip package as mentioned above, further comprising a step of forming an adhesive layer by spin-coating sandwiched between the sensing device wafer and the color layer or on the second bottom surface of the touch plate wafer or mixed within the color layer.

Another feature of this invention provides a method of manufacturing a chip scale sensing chip package as mentioned above, wherein the adhesive layer comprises a material consisted of medium-K or low-K dielectric materials.

Another feature of this invention provides a method of manufacturing a chip scale sensing chip package as mentioned above, wherein the touch plate and the sensing chip are of the same size.

Another feature of this invention provides a method of manufacturing a chip scale sensing chip package as mentioned above, wherein the top-viewing profiles of the touch plate and the sensing chip are rectangular.

Another feature of this invention provides a method of manufacturing a chip scale sensing chip package as mentioned above, wherein the touch plate comprises the material selected from one or more members of the group consisted of glass, sapphire, aluminum nitride and ceramic materials.

Another feature of this invention provides a method of manufacturing a chip scale sensing chip package as mentioned above, wherein the conductive structures comprise solder balls, solder bumps and conductive pillars.

Another feature of this invention provides a method of manufacturing a chip scale sensing chip package as mentioned above, wherein the touch plate wafer is formed on a temporary substrate, and the temporary is removed after the step of scribing to generate a plurality of individual chip scale sensing chip packages.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present invention are discussed in detail below. However, it should be noted that the embodiments provide many applicable inventive concepts that can be embodied in a variety of specific methods. The specific exemplary embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed.

Exemplary Embodiment 1:

A detailed description of the chip scale sensing chip package and a method of manufacturing the same according to embodiment 1 of this invention is given below with reference to the accompanied FIGS. 1A~1F.

Figure 1A:
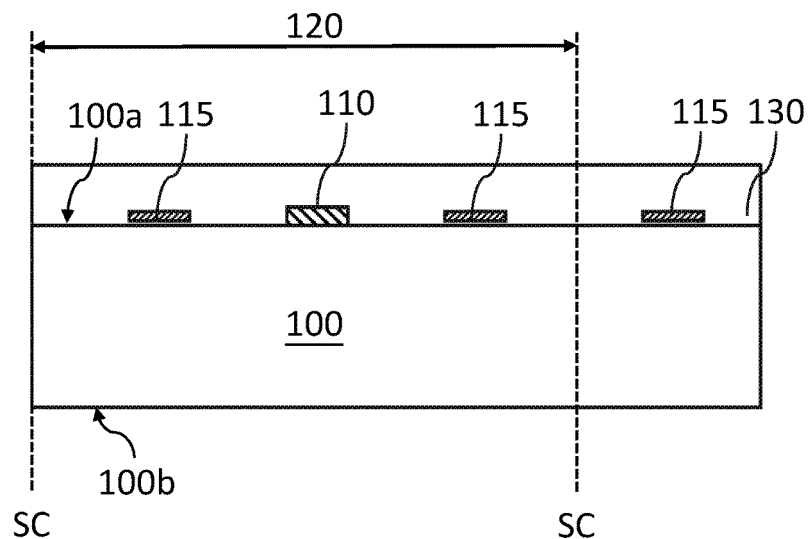
FIGS. 1A~1F are cross-sectional views of the exemplary embodiment 1 of a method of manufacturing a chip scale sensing chip package according to this present invention.

First, referring to FIG. 1A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, a color layer 130 with a thickness of about 25 μm is formed for example by spin-coating on the sensing device wafer 100.

Figure 1B:
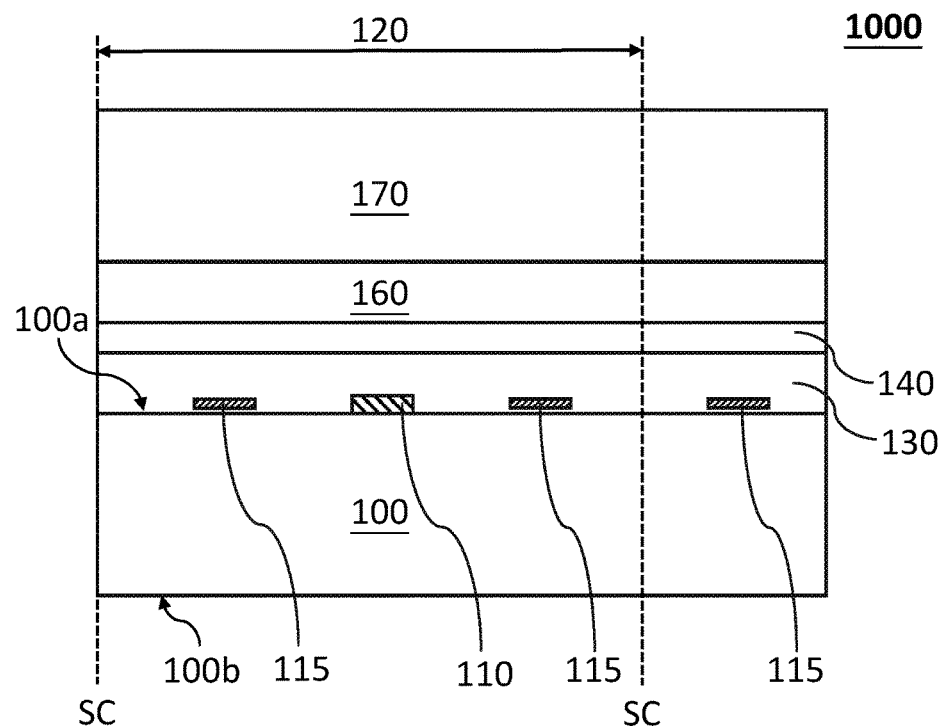

Next, referring to FIG. 1B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, an adhesive layer 140 consisted of a material selected from medium-K or low-K dielectric materials is formed for example by spin-coating on the color layer 130 or the touch plate wafer 160 to join the touch plate wafer 160 with the sensing device wafer 100 to form a stacking structure 1000. The touch plate wafer 160 is consisted of glass or other transparent materials with a hardness no less than 7, such as aluminum nitride, sapphire or ceramic materials.

Figure 1C:
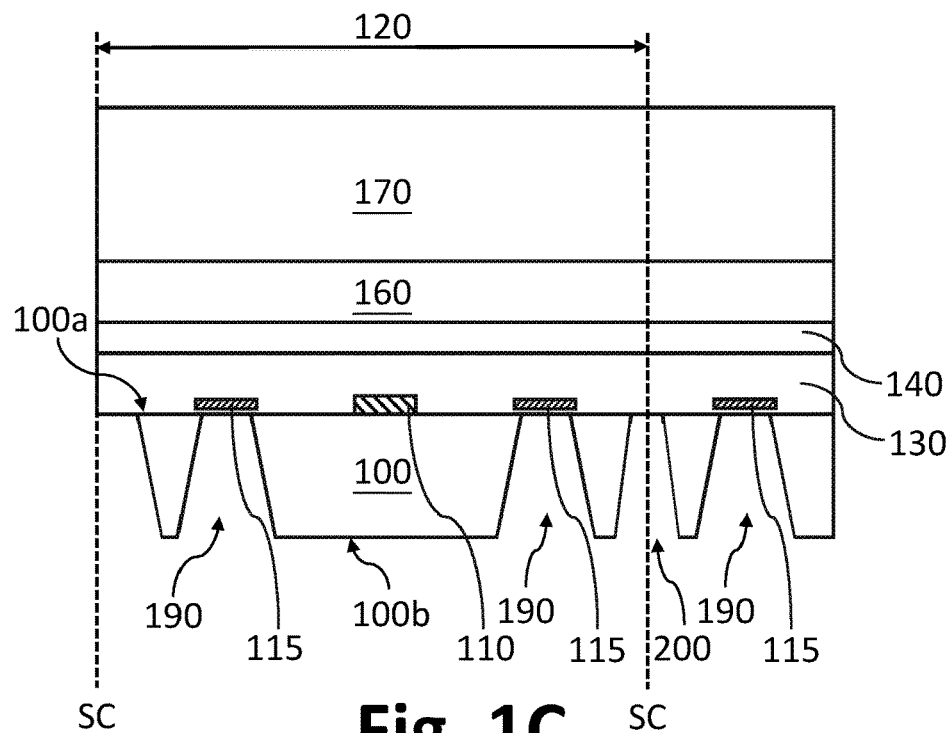

Next, referring to FIG. 1C, the first bottom surface 100b of the stacking structure 1000 is thinned by etching, milling, grinding or polishing to reduced its thickness till less than 100 μm.

Then, the first bottom surface 100b within each of the chip regions 120 is processed by photolithography and etching process such as dry-etching, wet-etching, plasma-etching, reactive ions-etching or other suitable process to form a plurality of first through silicon vias 190 exposing the conductive pads 115 and a plurality of openings 200 aligning with the scribe channels (SC).

Figure 1D:
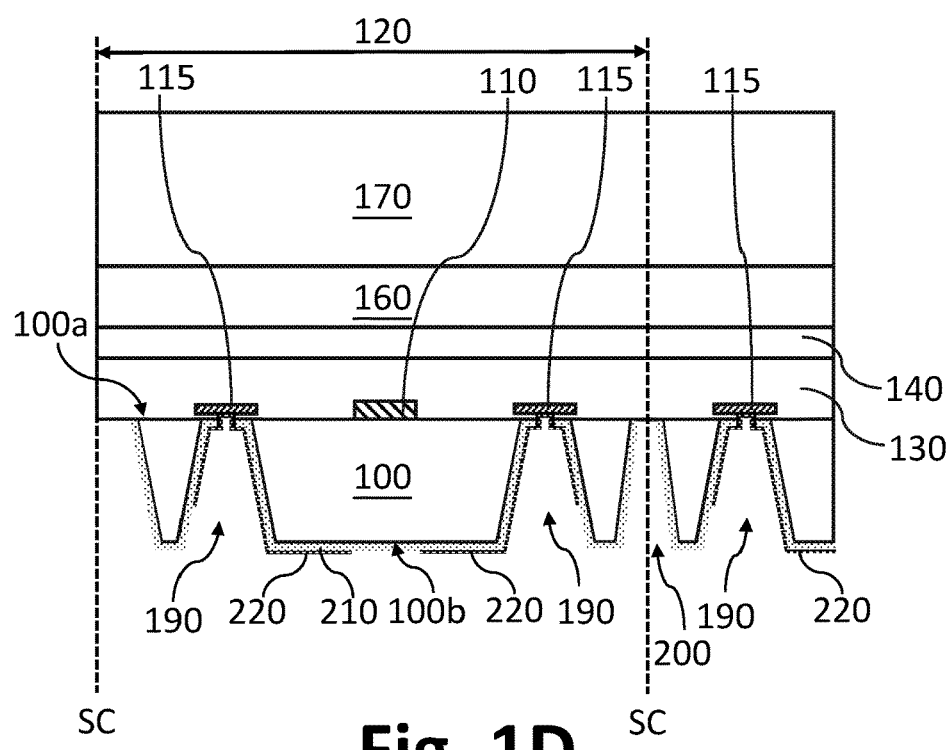

Next, referring to FIG. 1D, an insulating layer 210 is deposited to overlay the first bottom surface 100b of the sensing device wafer 100, and the first through silicon vias 190 and the openings 200 by spin-coating, CVD, PVD or other suitable processes. The insulating layer 210 of this present embodiment 1 comprises one or more materials selected from epoxy resin, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, the insulating layer 210 under each of the first through silicon vias 190 is removed by photolithography and etching processes to form a plurality of second through silicon vias (not shown) exposing corresponding conductive pad 115. Then, a patterned re-distribution layer (RDL) 220 is formed on the insulating layer 210 and conformably overlay the side wall (not shown) and bottom wall (not shown) of each first through hole and each second through silicon via (not shown) by deposition processes (e.g. spin-coating, PVD, CVD, electroplating, electroless-deposition, or other suitable process) followed by photolithography and etching processes. The RDL 220 is separated from the sensing device wafer 100 by the insulating layer 210, and electrically connected to the exposed conductive pad 115 via the first through silicon vias 190 and the second through holes (not shown). The RDL 220 of this present embodiment is consisted of a material comprising aluminum, copper, gold, platinum, nickel or combination thereof, or conductive polymers, conductive ceramic materials (e.g. ITO or IZO) or other suitable conductive materials. Moreover, the RDL 220 can be an asymmetrical pattern. For example, the RDL 220 within each of the first through silicon vias 190 does not extend onto the first bottom surface 100b nearby the outer edge (not shown) of chip area 120 adjacent to the scribe channel (SC).

Figure 1E:
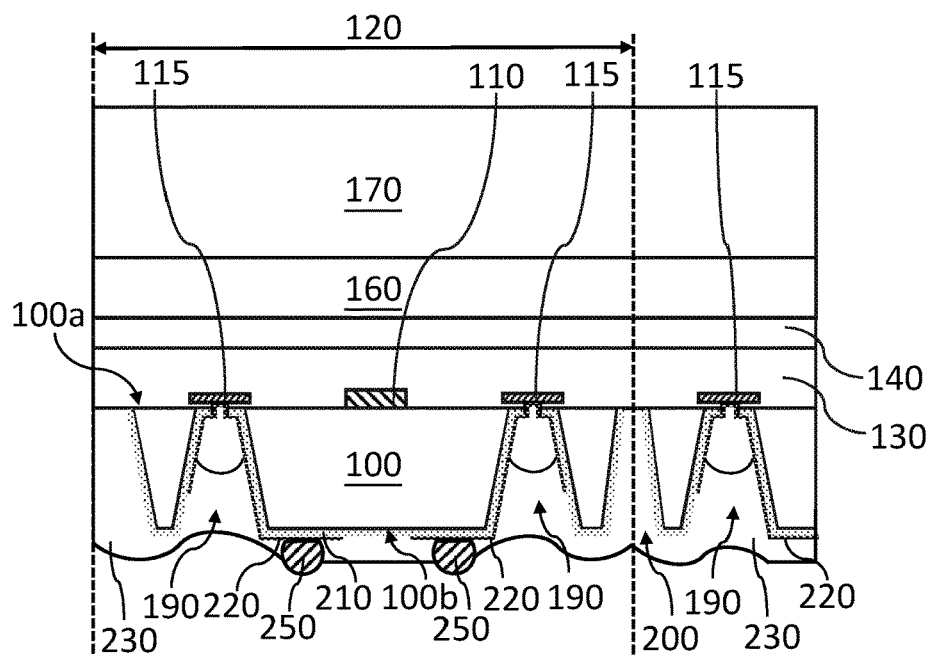

Next, referring to FIG. 1E, a passivation layer 230 is deposited on the first bottom surface 100b of the sensing device wafer 100 and overlay the first through silicon vias 190, the openings 200 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo butane, poly-p-xylene, naphthalene polymer, chlorofluorocarbons or acrylic ester) or other suitable materials. The passivation layer 230 of this present embodiment is used to partially fill the first through silicon via 190 to form a via (not shown) between the RDL 220 and the passivation layer 230 in each through hole 190. In one of the embodiments according to this invention, the boundary between the via (not shown) and the passivation layer 230 has an arc profile. Alternatively, the first through silicon vias 190 can also be filled up with the passivation layer 230 in other embodiments.

Next, a plurality of third through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the third through silicon vias (not shown) on the passivation 230 to electrically connect to the RDL 220. The conductive structures 250 is consisted of a material comprising tin, lead, copper, gold, nickel or combination thereof.

Next, a scribing process is applied along with the scribe channel (SC) to scribe the passivation layer 230, the color layer 130, the adhesive layer 140, the touch plate wafer 160 and the temporary substrate 170. Then, a plurality of chip scale sensing chip packages A are generated after removing the temporary substrate 170. Each chip scale sensing chip package A comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Figure 1F:
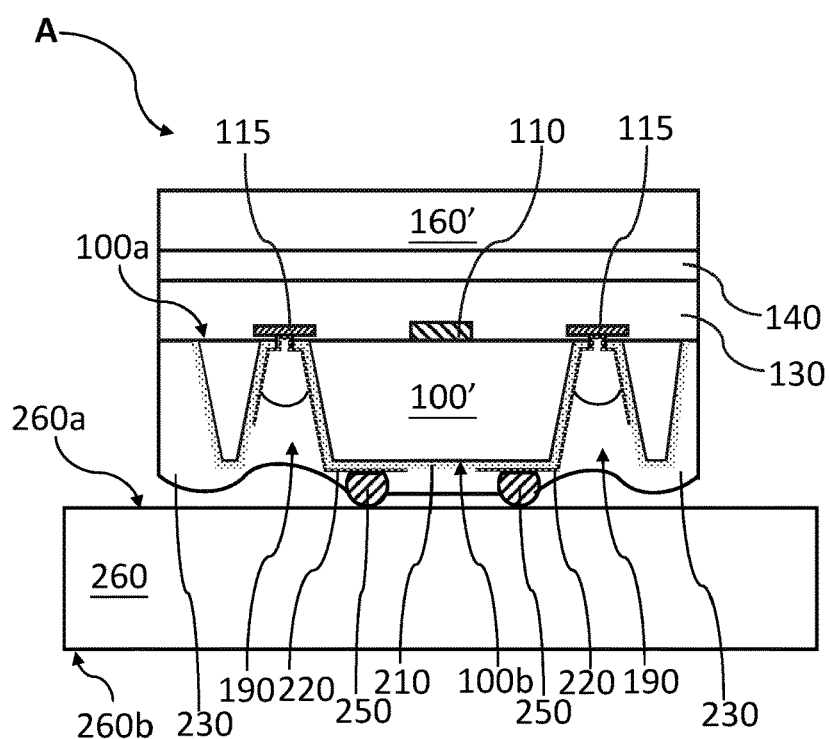

Finally, please referring to FIG. 1F, a circuit board 260 with a top surface 260a and a bottom surface 260b is provided. Then, the chip scale sensing chip package A is bounded to the top surface 260a of the circuit board 260, and electrically connected to the circuit board 260 through the conductive structures 250. For example, the chip scale sensing chip package A can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package A is bounded to the circuit board 260. Alternatively, abovementioned passive devices can be formed on the circuit board 260 together with the chip scale sensing chip package A during the same reflow process.

Exemplary Embodiment 2:

A detailed description of the chip scale sensing chip package and a method of manufacturing the same according to embodiment 2 of this invention is given below with reference to the accompanied FIGS. 2A~2F.

Figure 2A:
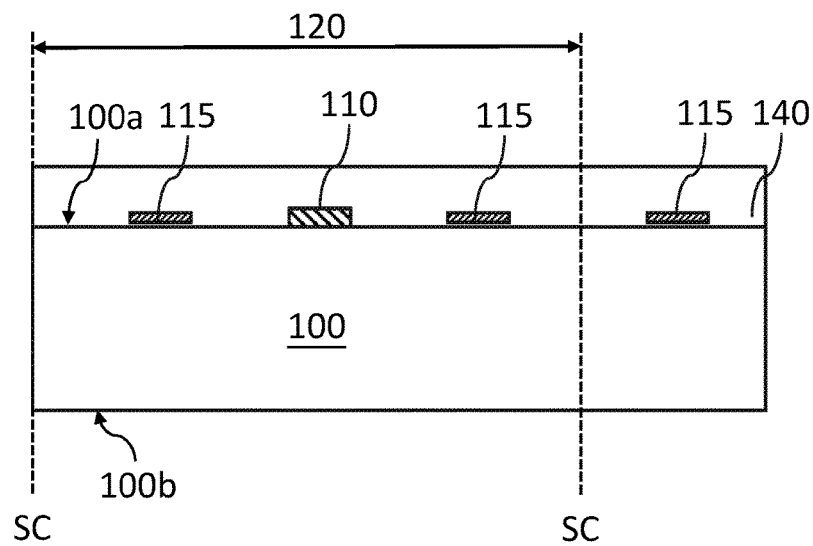
FIGS. 2A~2F are cross-sectional views of the exemplary embodiment 2 of a method of manufacturing a chip scale sensing chip package according to this present invention.

First, please referring to FIG. 2A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, an adhesive layer 140 consisted of a material selected from medium-K or low-K dielectric materials is formed for example by spin-coating on the first top surface 100a of the sensing device wafer 100.

Figure 2B:
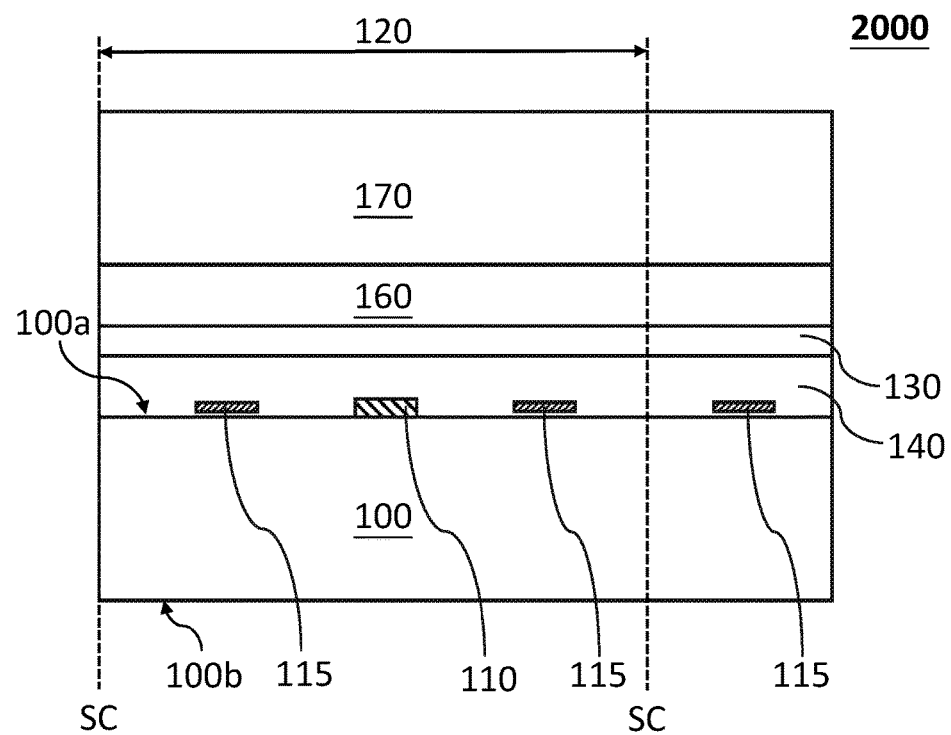

Next, referring to FIG. 2B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, a color layer 130 with a thickness of about 25 μm is formed for example by spin-coating on the touch plate wafer 160. The touch plate wafer 160 is joined with the sensing device wafer 100 to form a stacking structure 2000 by sandwiched the adhesive layer 140 therebetween. The touch plate wafer 160 is consisted of glass or other transparent materials with a hardness no less than 7, such as aluminum nitride, sapphire or ceramic materials.

Figure 2C:
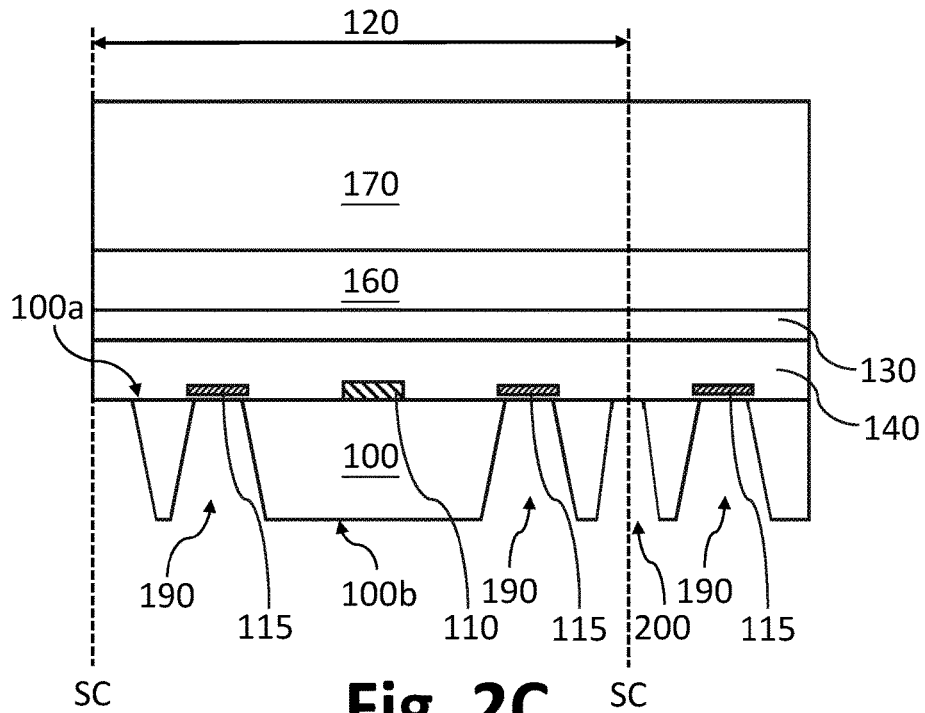

Next, referring to FIG. 2C, the first bottom surface 100b of the stacking structure 1000 is thinned by etching, milling, grinding or polishing to reduced its thickness till less than 100 μm. Then, the first bottom surface 100b within each of the chip regions 120 is processed by photolithography and etching process such as dry-etching, wet-etching, plasma-etching, reactive ions-etching or other suitable process to form a plurality of first through silicon vias 190 exposing the conductive pads 115 and a plurality of openings 200 aligning with the scribe channels (SC).

Figure 2D:
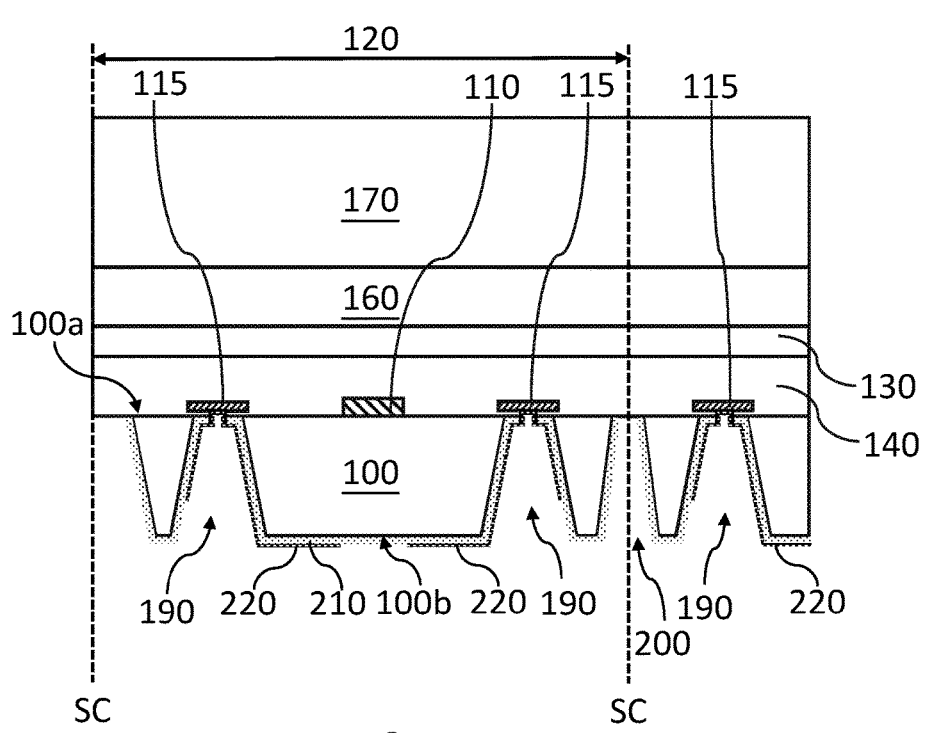

Next, referring to FIG. 2D, an insulating layer 210 is deposited to overlay the first bottom surface 100b of the sensing device wafer 100, and the first through silicon vias 190 and the openings 200 by spin-coating, CVD, PVD or other suitable processes. The insulating layer 210 of this present embodiment 1 comprises one or more materials selected from epoxy resin, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, the insulating layer 210 under each of the first through silicon vias 190 is removed by photolithography and etching processes to form a plurality of second through silicon vias (not shown) exposing corresponding conductive pad 115. Then, a patterned re-distribution layer (RDL) 220 is formed on the insulating layer 210 and conformably overlay the side wall (not shown) and bottom wall (not shown) of each first through hole and each second through silicon via (not shown) by deposition processes (e.g. spin-coating, PVD, CVD, electroplating, electroless-deposition, or other suitable process) followed by photolithography and etching processes. The RDL 220 is separated from the sensing device wafer 100 by the insulating layer 210, and electrically connected to the exposed conductive pad 115 via the first through silicon vias 190 and the second through silicon vias (not shown). The RDL 220 of this present embodiment is consisted of a material comprising aluminum, copper, gold, platinum, nickel or combination thereof, or conductive polymers, conductive ceramic materials (e.g. ITO or IZO) or other suitable conductive materials. Moreover, the RDL 220 can be an asymmetrical pattern. For example, the RDL 220 within each of the first through silicon vias 190 does not extend onto the first bottom surface 100b nearby the outer edge (not shown) of chip area 120 adjacent to the scribe channel (SC).

Figure 2E:
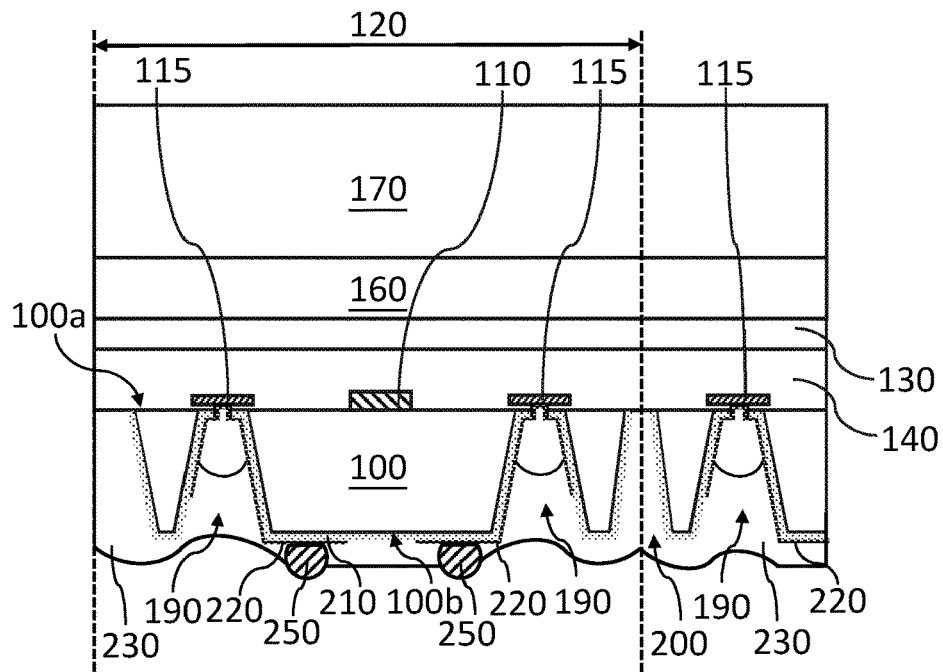

Next, referring to FIG. 2E, a passivation layer 230 is deposited on the first bottom surface 100b of the sensing device wafer 100 and overlay the first through silicon vias 190, the openings 200 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials. The passivation layer 230 of this present embodiment is used to partially fill the first through silicon via 190 to form a via (not shown) between the RDL 220 and the passivation layer 230 in each through hole 190. In one of the embodiments according to this invention, the boundary between the via (not shown) and the passivation layer 230 has an arc profile. Alternatively, the first through silicon vias 190 can also be filled up with the passivation layer 230 in other embodiments.

Next, a plurality of third through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the third through silicon vias (not shown) on the passivation 230 to electrically connect to the RDL 220. The conductive structures 250 is consisted of a material comprising tin, lead, copper, gold, nickel or combination thereof.

Figure 2F:
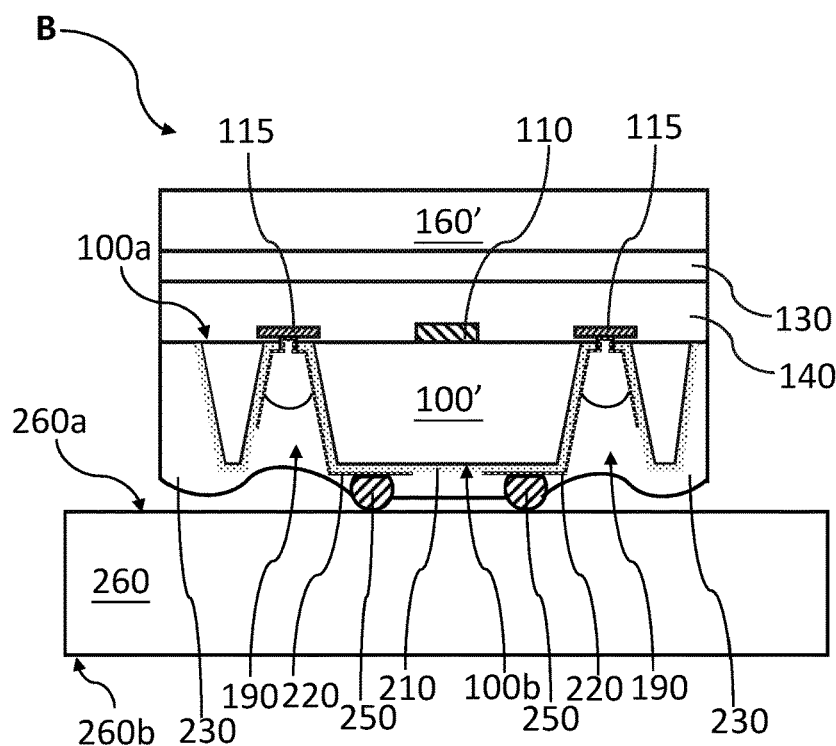

Next, please referring to FIG. 2F, a scribing process is applied along with the scribe channel (SC) to scribe the passivation layer 230, the adhesive layer 140, the color layer 130, the touch plate wafer 160 and the temporary substrate 170. Then, a plurality of chip scale sensing chip packages B are generated after removing the temporary substrate 170. Each chip scale sensing chip package B comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Finally, a circuit board 260 with a top surface 260a and a bottom surface 260b is provided. Then, the chip scale sensing chip package B is bounded to the top surface 260a of the circuit board 260, and electrically connected to the circuit board 260 through the conductive structures 250. For example, the chip scale sensing chip package B can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package B is bounded to the circuit board 260. Alternatively, abovementioned passive devices can be formed on the circuit board 260 together with the chip scale sensing chip package B during the same reflow process.

Exemplary Embodiment 3:

A detailed description of the chip scale sensing chip package and a method of manufacturing the same according to embodiment 3 of this invention is given below with reference to the accompanied FIGS. 3A~3F.

Figure 3A:
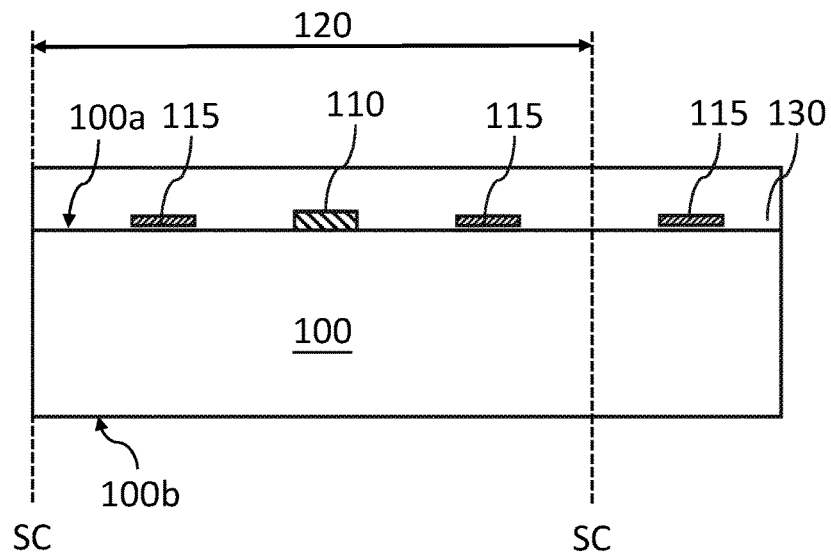
FIGS. 3A~3F are cross-sectional views of the exemplary embodiment 3 of a method of manufacturing a chip scale sensing chip package according to this present invention.

First, please referring to FIG. 3A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, a color layer 150 comprising an adhesive consisted of a material selected from medium-K or low-K dielectric materials is formed for example by spin-coating on the first top surface 100a of the sensing device wafer 100.

Figure 3B:
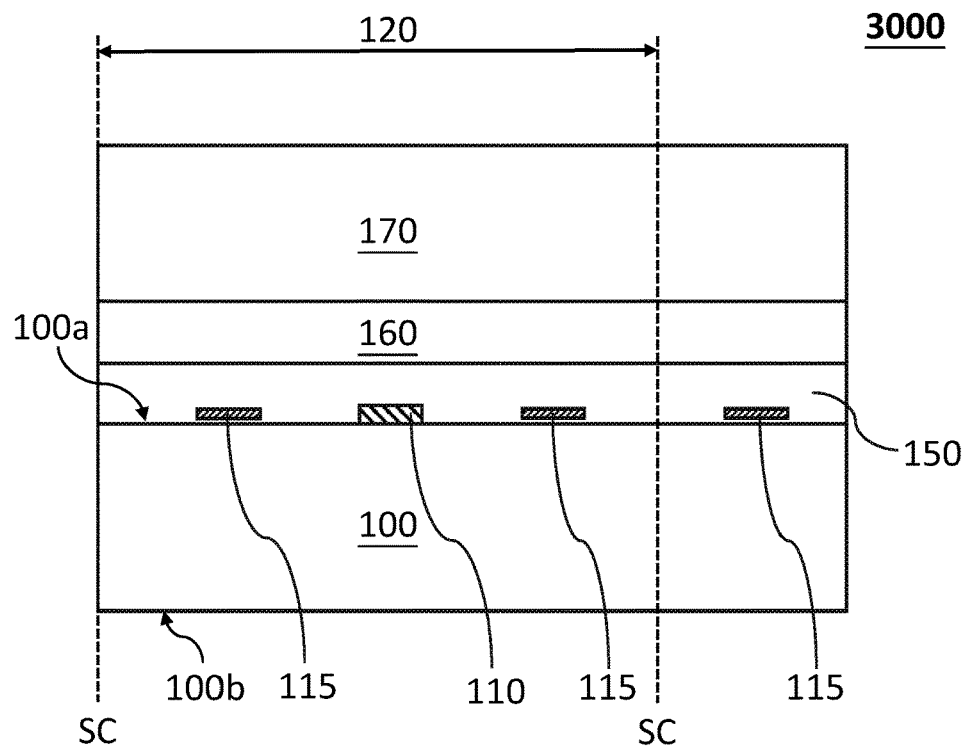

Next, referring to FIG. 3B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, the touch plate wafer 160 is joined with the sensing device wafer 100 to form a stacking structure 3000 by sandwiched the color layer 150 comprising an adhesive therebetween. According to other embodiments, the color layer 150 comprising an adhesive can also be spin-coated on the touch plate wafer 160. The touch plate wafer 160 is consisted of glass or other transparent materials with a hardness no less than 7, such as aluminum nitride, sapphire or ceramic materials.

Figure 3C:
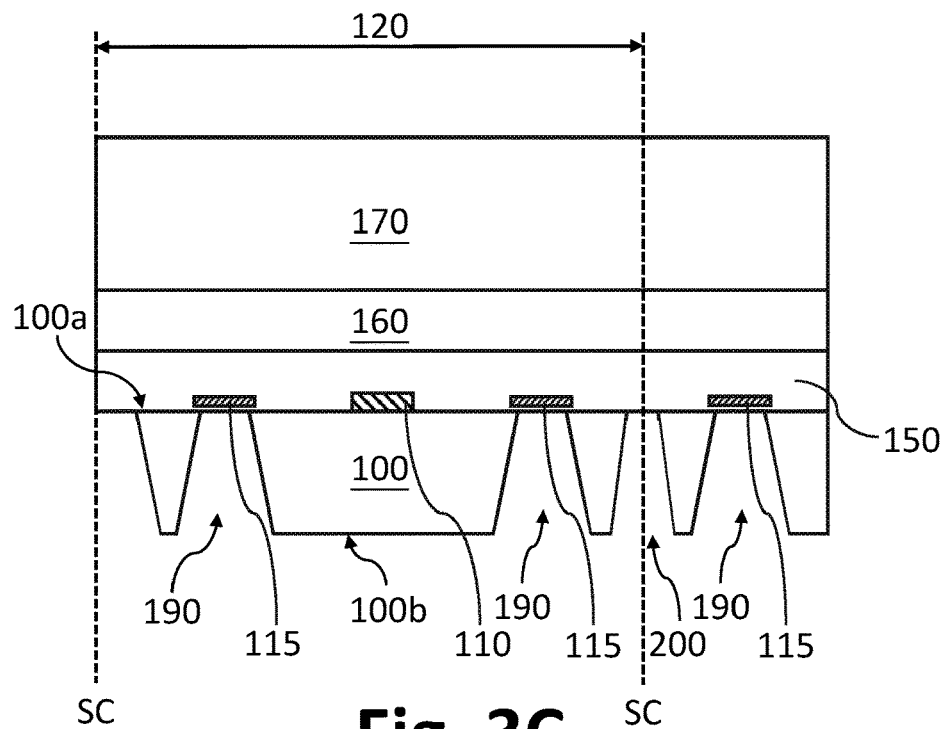

Next, referring to FIG. 3C, the first bottom surface 100b of the stacking structure 3000 is thinned by etching, milling, grinding or polishing to reduced its thickness till less than 100 μm. Then, the first bottom surface 100b within each of the chip regions 120 is processed by photolithography and etching process such as dry-etching, wet-etching, plasma-etching, reactive ions-etching or other suitable process to form a plurality of first through silicon vias 190 exposing the conductive pads 115 and a plurality of openings 200 aligning with the scribe channels (SC).

Figure 3D:
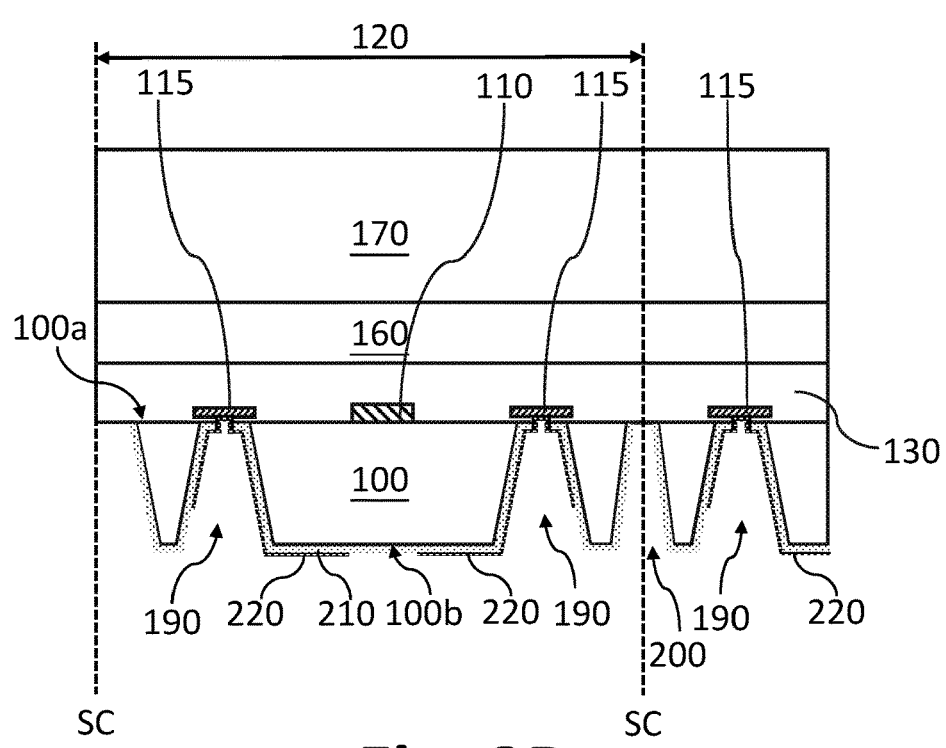

Next, referring to FIG. 3D, an insulating layer 210 is deposited to overlay the first bottom surface 100b of the sensing device wafer 100, and the first through silicon vias 190 and the openings 200 by spin-coating, CVD, PVD or other suitable processes. The insulating layer 210 of this present embodiment 1 comprises one or more materials selected from epoxy resin, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, the insulating layer 210 under each of the first through silicon vias 190 is removed by photolithography and etching processes to form a plurality of second through silicon vias (not shown) exposing corresponding conductive pad 115. Then, a patterned re-distribution layer (RDL) 220 is formed on the insulating layer 210 and conformably overlay the side wall (not shown) and bottom wall (not shown) of each first through silicon via 190 and each second through silicon via (not shown) by deposition processes (e.g. spin-coating, PVD, CVD, electroplating, electroless-deposition, or other suitable process) followed by photolithography and etching processes. The RDL 220 is separated from the sensing device wafer 100 by the insulating layer 210, and electrically connected to the exposed conductive pad 115 via each first through silicon via 190 and each second through silicon via (not shown). The RDL 220 of this present embodiment is consisted of a material comprising aluminum, copper, gold, platinum, nickel or combination thereof, or conductive polymers, conductive ceramic materials (e.g. ITO or IZO) or other suitable conductive materials. Moreover, the RDL 220 can be an asymmetrical pattern. For example, the RDL 220 within each first through silicon via 190 does not extend onto the first bottom surface 100b nearby the outer edge (not shown) of chip area 120 adjacent to the scribe channel (SC).

Figure 3E:
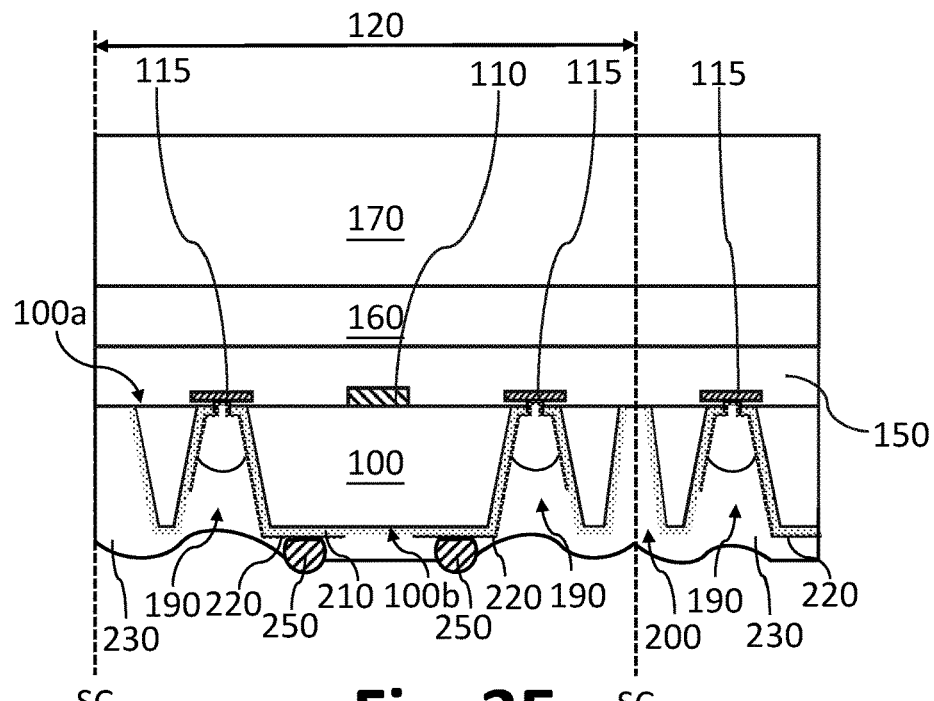

Next, referring to FIG. 3E, a passivation layer 230 is deposited on the first bottom surface 100b of the sensing device wafer 100 and overlay the first through silicon vias 190, the openings 200 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials. The passivation layer 230 of this present embodiment is used to partially fill the first through silicon via 190 to form a via (not shown) between the RDL 220 and the passivation layer 230 in each through hole 190. In one of the embodiments according to this invention, the boundary between the via (not shown) and the passivation layer 230 has an arc profile. Alternatively, the first through silicon vias 190 can also be filled up with the passivation layer 230 in other embodiments.

Next, a plurality of third through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the third through silicon vias (not shown) on the passivation 230 to electrically connect to the RDL 220. The conductive structures 250 is consisted of a material comprising tin, lead, copper, gold, nickel or combination thereof.

Figure 3F:
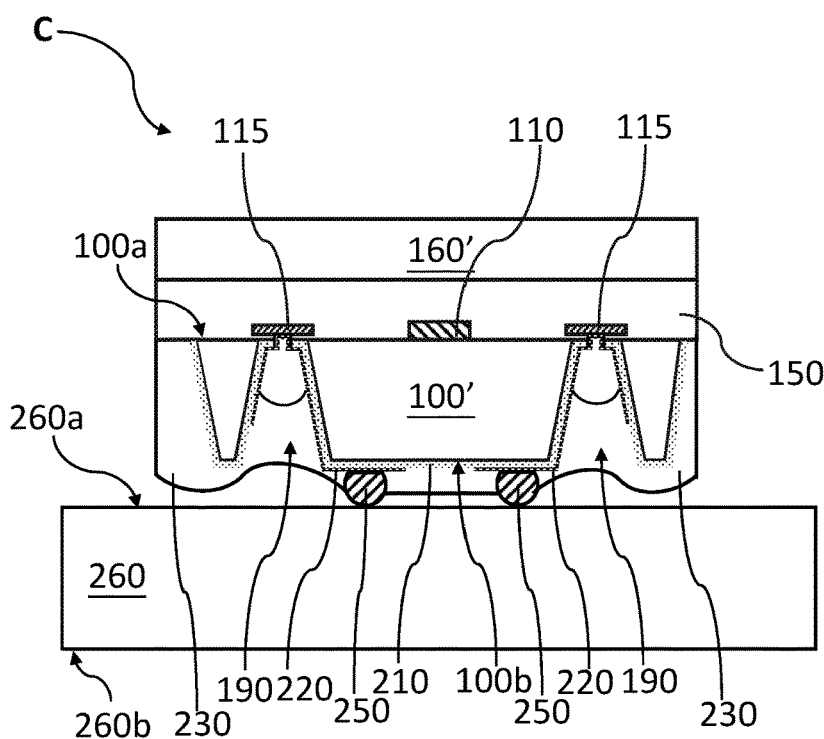

Next, please referring to FIG. 3F, a scribing process is applied along with the scribe channel (SC) to scribe the color layer 150 comprising an adhesive, the touch plate wafer 160 and the temporary substrate 170. Then, a plurality of chip scale sensing chip packages C are generated after removing the temporary substrate 170. Each chip scale sensing chip package C comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Finally, a circuit board 260 with a top surface 260a and a bottom surface 260b is provided. Then, the chip scale sensing chip package C is bounded to the top surface 260a of the circuit board 260, and electrically connected to the circuit board 260 through the conductive structures 250. For example, the chip scale sensing chip package C can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package C is bounded to the circuit board 260. Alternatively, abovementioned passive devices can be formed on the circuit board 260 together with the chip scale sensing chip package C during the same reflow process.

Exemplary Embodiment 4:

A detailed description of the chip scale sensing chip package and a method of manufacturing the same according to embodiment 4 of this invention is given below with reference to the accompanied FIGS. 4A~4F.

Figure 4A:
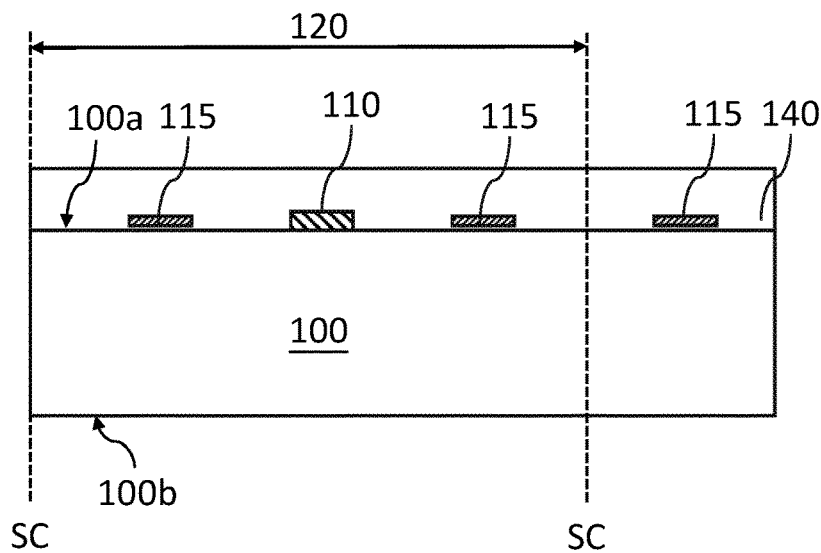
FIGS. 4A~4F are cross-sectional views of the exemplary embodiment 4 of a method of manufacturing a chip scale sensing chip package according to this present invention.

First, referring to FIG. 4A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, a color layer 130 with a thickness of about 25 μm is formed for example by spin-coating on the sensing device wafer 100.

Figure 4B:
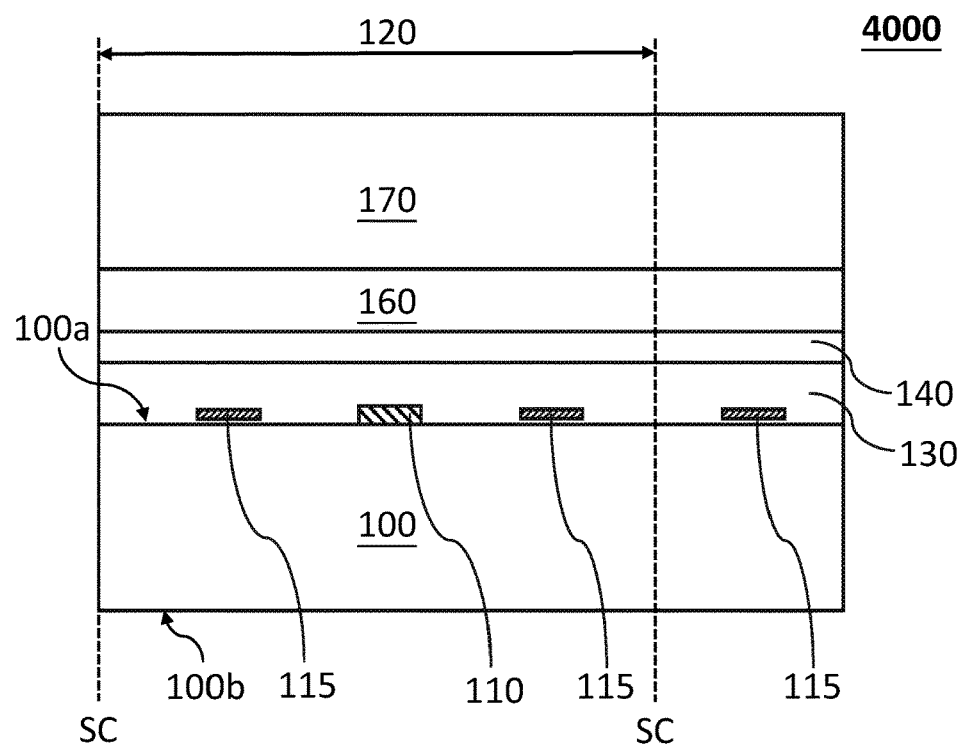

Next, referring to FIG. 4B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, an adhesive 140 consisted of a material selected from medium-K or low-K dielectric materials is formed for example by spin-coating on the color layer 130 or the touch plate wafer 160 to join the touch plate wafer 160 with the sensing device wafer 100 to form a stacking structure 4000. The touch plate wafer 160 is consisted of glass or other transparent materials with a hardness no less than 7, such as aluminum nitride, sapphire or ceramic materials.

Figure 4C:
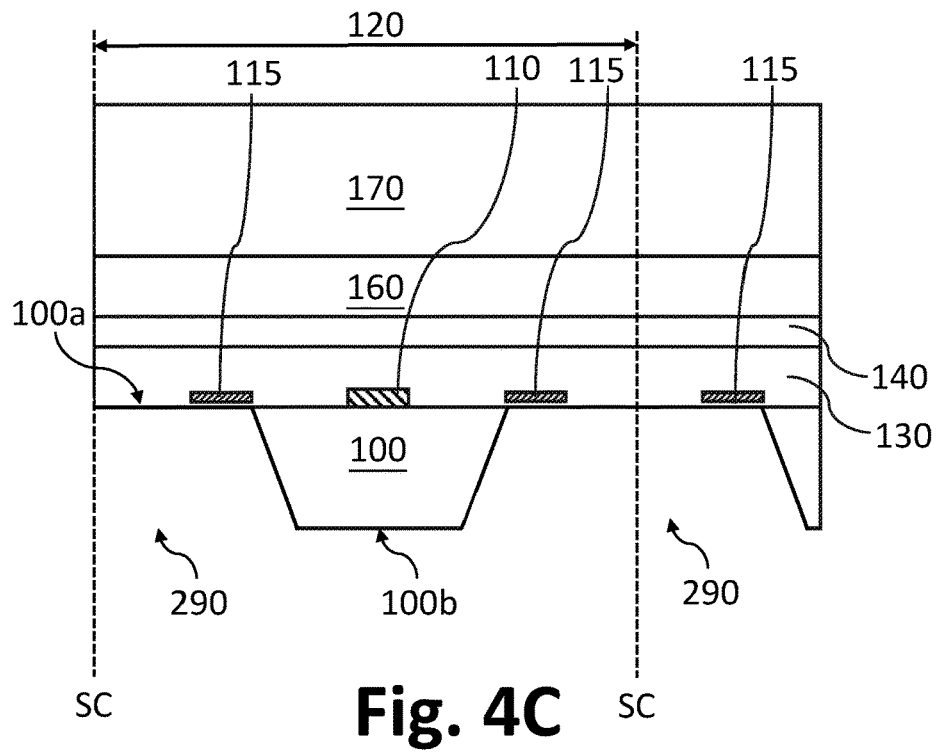

Next, referring to FIG. 4C, the first bottom surface 100b of the stacking structure 4000 is thinned by etching, milling, grinding or polishing to reduced its thickness till less than 100 μm. Then, the first bottom surface 100b within each of the chip regions 120 is processed by photolithography and etching process such as dry-etching, wet-etching, plasma-etching, reactive ions-etching or other suitable process to form a plurality of fourth through silicon vias 290 corresponding to the conductive pads 115.

Figure 4D:
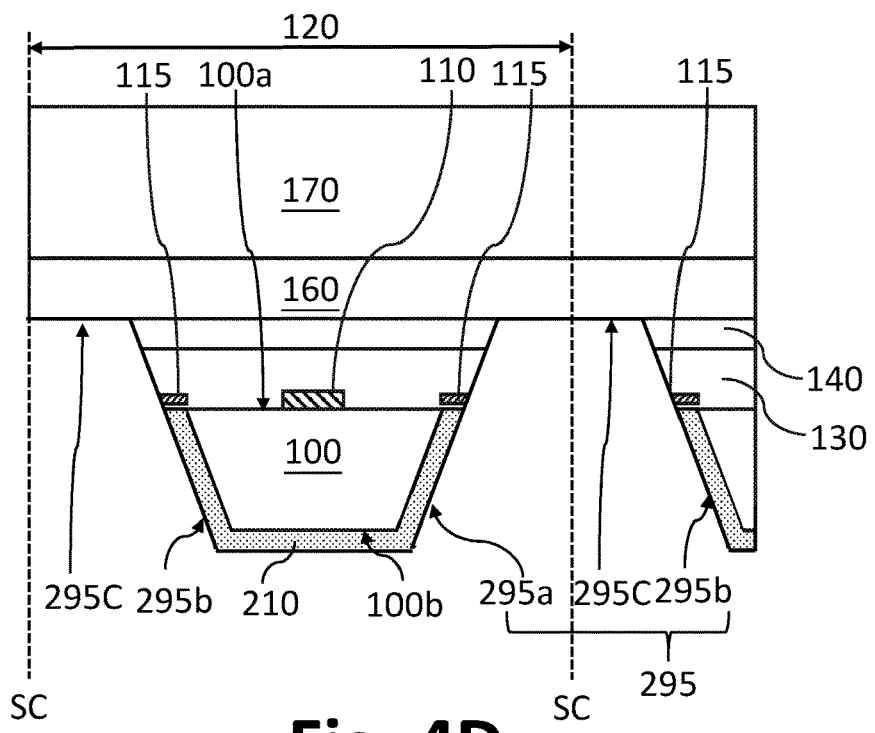

Next, referring to FIG. 4D, an insulating layer 210 is deposited to overlay the first bottom surface 100b of the wafer 100 and the fourth through silicon vias 290 by means of spin-coating, CVD, PVD or other suitable process. The insulating layer 210 of this present embodiment comprises epoxy resin, inorganic material (e.g. silicon oxide, silicon nitride, silicon oxynitride, metal oxide or combination thereof), organic polymer (e.g. polyimide, benzo cyclo butane, poly-p-xylene, naphthalene polymer, chlorofluorocarbons or acrylic ester) or other suitable materials.

Next, a plurality of notches 295 are formed by removing partial of the insulating layers 210 and the color layer 130, and partial of the conductive pads 115 nearby each of the fourth through holes 290, and partial of the adhesive layer 140 by means of the so-called notching processes. Each notch 295 comprises a first side wall 295a, a second sidewall 295b and a bottom wall 295c adjoined therebetween, wherein both the first side wall 295a and the second sidewall 295b expose the edges (not shown) of the conductive pads 115 thereon.

Figure 4E:
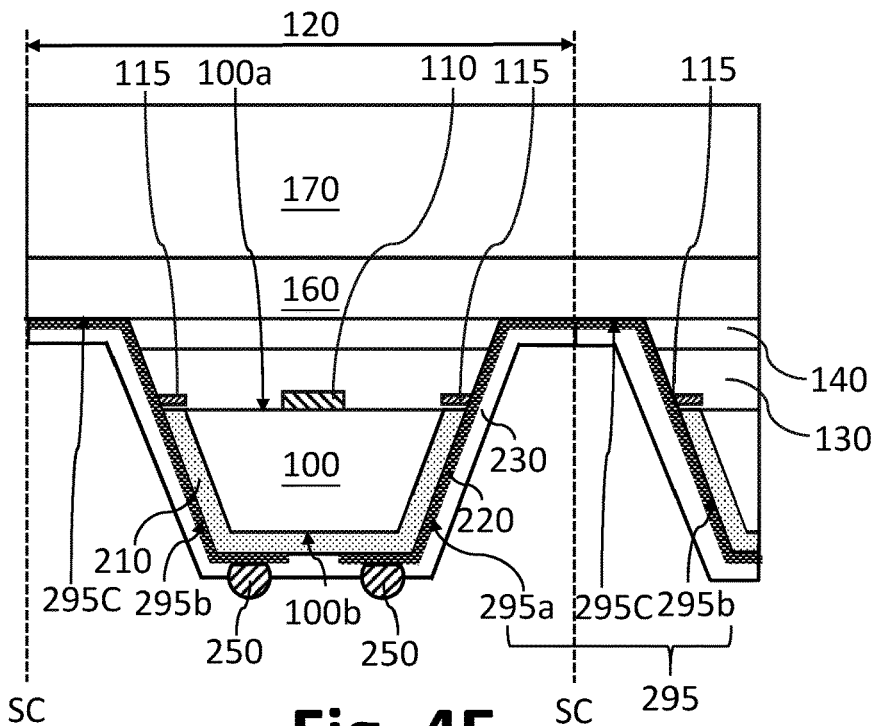

Next, referring to FIG. 4E, a patterned re-distribution layer (RDL) 220 is conformably formed on the insulating layer 210 by means of deposition processes (e.g. spin-coating, PVD, CVD, electroplating, electroless-deposition, or other suitable process), photolithography and etching processes. The RDL 220 conformably is extended onto the first sidewall 295a, the second sidewall 295b and the bottom wall 295c of each notch 295. The RDL 220 is separated from the sensing device wafer 210 by the insulating layer 210, and interconnected to the exposed edges (not shown) of the conductive pads 115 on the first sidewall 295a and the second sidewall 295b. The RDL 220 comprises aluminum, copper, gold, platinum, nickel or combination thereof, or conductive polymers, conductive ceramic materials (e.g. ITO or IZO) or other suitable conductive materials.

Next, a passivation layer 230 is deposited to overlay the second bottom surface 100b of the sensing device wafer 100 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, a plurality of fifth through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the fifth through silicon vias (not shown) on the passivation 230 to electrically connect to the RDL 220. The conductive structures 250 is consisted of a material comprising tin, lead, copper, gold, nickel or combination thereof.

Figure 4F:
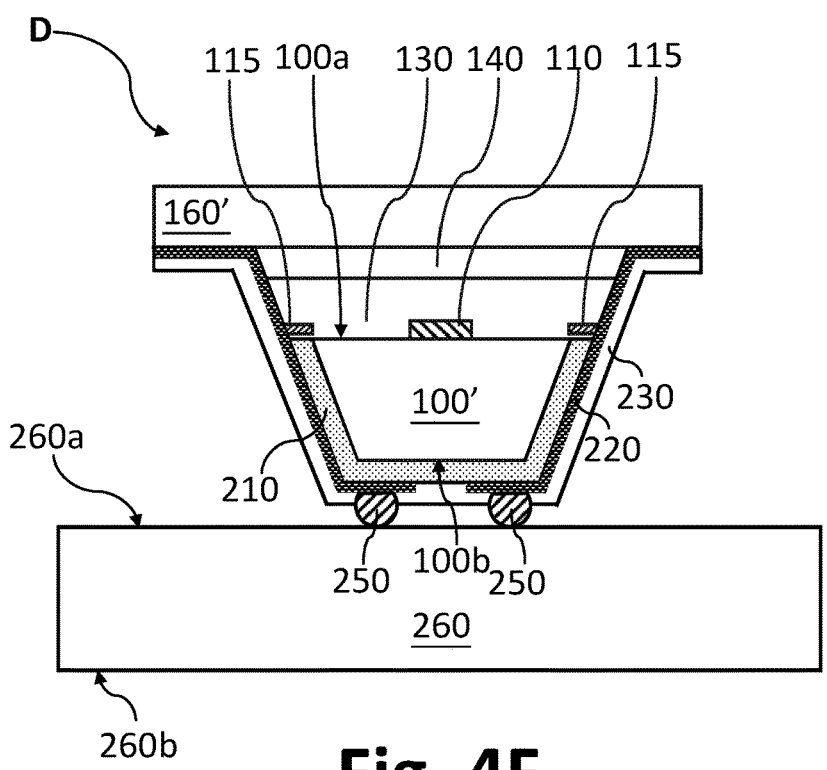

Next, please referring to FIG. 4F, a scribing process is applied along with the scribe channel (SC) to scribe the passivation 230, the RDL 220, the touch plate wafer 160 and the temporary substrate 170. Then, a plurality of chip scale sensing chip packages D are generated after removing the temporary substrate 170. Each chip scale sensing chip package D comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Finally, a circuit board 260 with a top surface 260a and a bottom surface 260b is provided. Then, the chip scale sensing chip package D is bounded to the top surface 260a of the circuit board 260, and electrically connected to the circuit board 260 through the conductive structures 250. For example, the chip scale sensing chip package D can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package D is bounded to the circuit board 260. Alternatively, abovementioned passive devices can be formed on the circuit board 260 together with the chip scale sensing chip package D during the same reflow process.

Exemplary Embodiment 5:

A detailed description of the chip scale sensing chip package and a method of manufacturing the same according to embodiment 5 of this invention is given below with reference to the accompanied FIGS. 5A~5F.

Figure 5A:
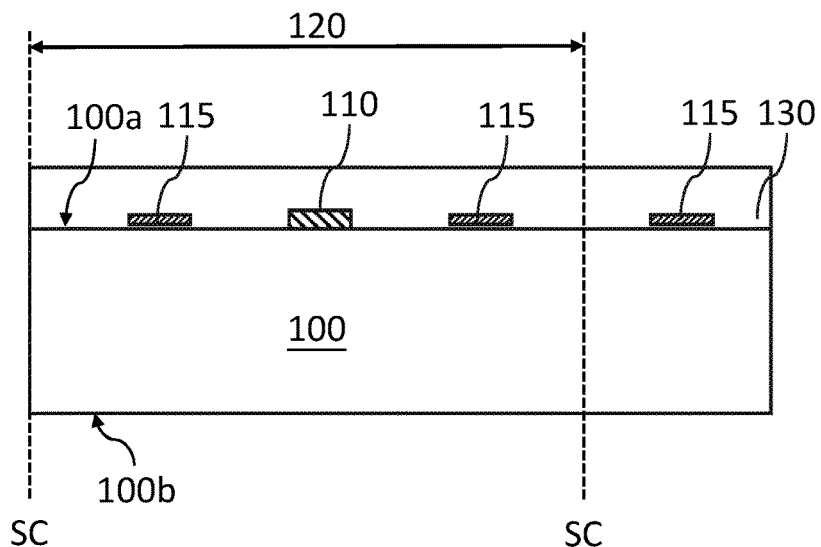
FIGS. 5A~5F are cross-sectional views of the exemplary embodiment 5 of a method of manufacturing a chip scale sensing chip package according to this present invention.

First, referring to FIG. 5A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, an adhesive 140 consisted of a material selected from medium-K or low-K dielectric materials is formed for example by spin-coating on the sensing device wafer 100.

Figure 5B:
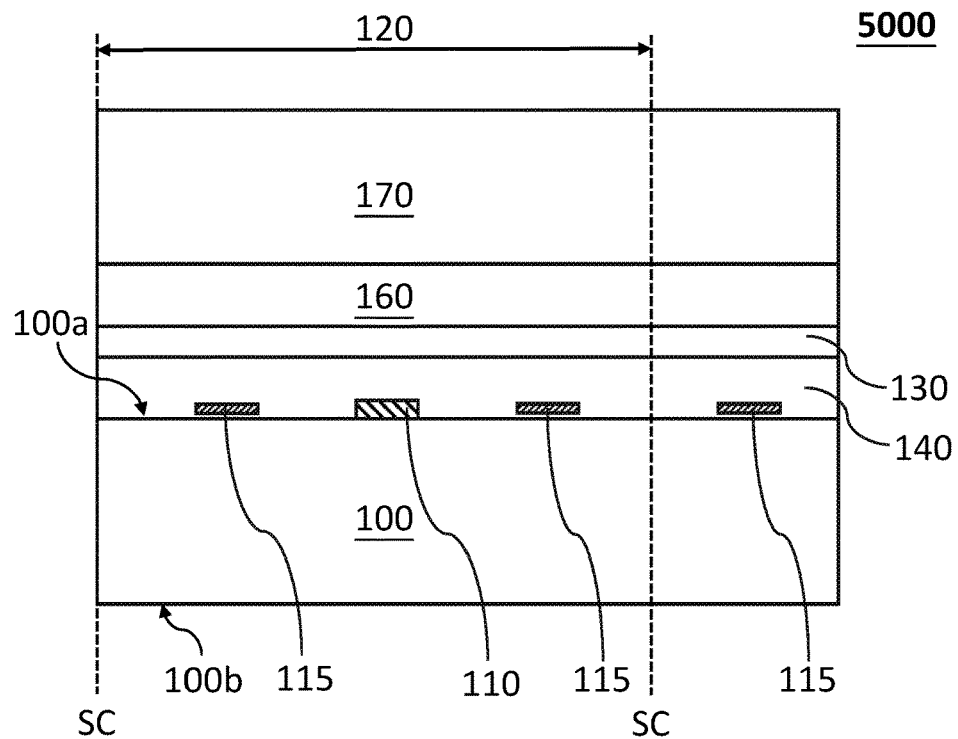

Next, referring to FIG. 5B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, a color layer 130 is spin-coated on the touch plate wafer 160 to join the touch plate wafer 160 with the sensing device wafer 100 to form a stacking structure 5000. The touch plate wafer 160 is consisted of glass or other transparent materials with a hardness no less than 7, such as aluminum nitride, sapphire or ceramic materials.

Figure 5C:
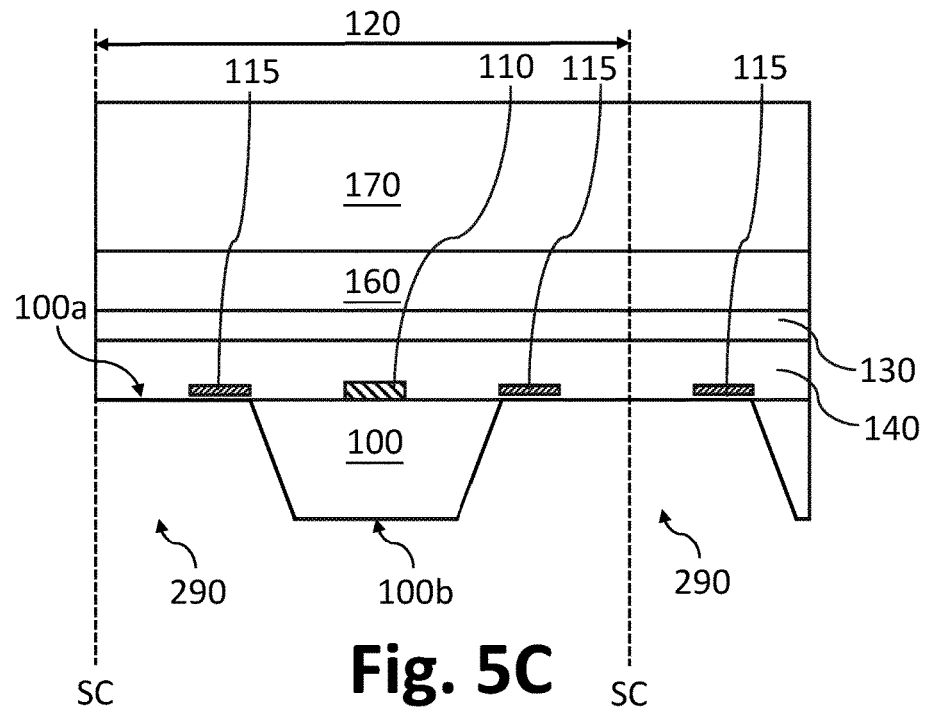

Next, referring to FIG. 5C, the first bottom surface 100b of the stacking structure 5000 is thinned by etching, milling, grinding or polishing to reduced its thickness till less than 100 μm. Then, the first bottom surface 100b within each of the chip regions 120 is processed by photolithography and etching process such as dry-etching, wet-etching, plasma-etching, reactive ions-etching or other suitable process to form a plurality of fourth through silicon vias 290 corresponding to the conductive pad 115.

Figure 5D:
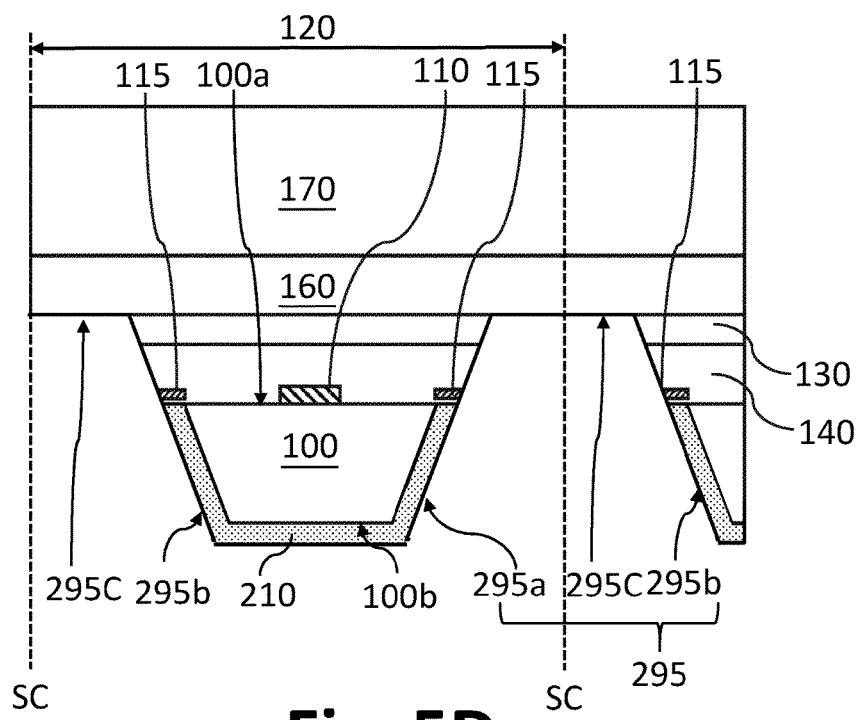

Next, referring to FIG. 5D, an insulating layer 210 is deposited to overlay the first bottom surface 100b of the wafer 100 and the fourth through silicon vias 290 by means of spin-coating, CVD, PVD or other suitable process. The insulating layer 210 of this present embodiment comprises epoxy resin, inorganic material (e.g. silicon oxide, silicon nitride, silicon oxynitride, metal oxide or combination thereof), organic polymer (e.g. polyimide, benzo cyclo butane, poly-p-xylene, naphthalene polymer, chlorofluorocarbons or acrylic ester) or other suitable materials.

Next, a plurality of notches 295 are formed by removing partial of the insulating layers 210 and the adhesive layer 140, and partial of the conductive pads 115 nearby each of the fourth through holes 290, and partial of the color layer 120 by means of the so-called notching processes. Each notch 295 comprises a first side wall 295a, a second sidewall 295b and a bottom wall 295c adjoined therebetween, wherein both the first side wall 295a and the second sidewall 295b expose the edges of the conductive pads 115 thereon.

Figure 5E:
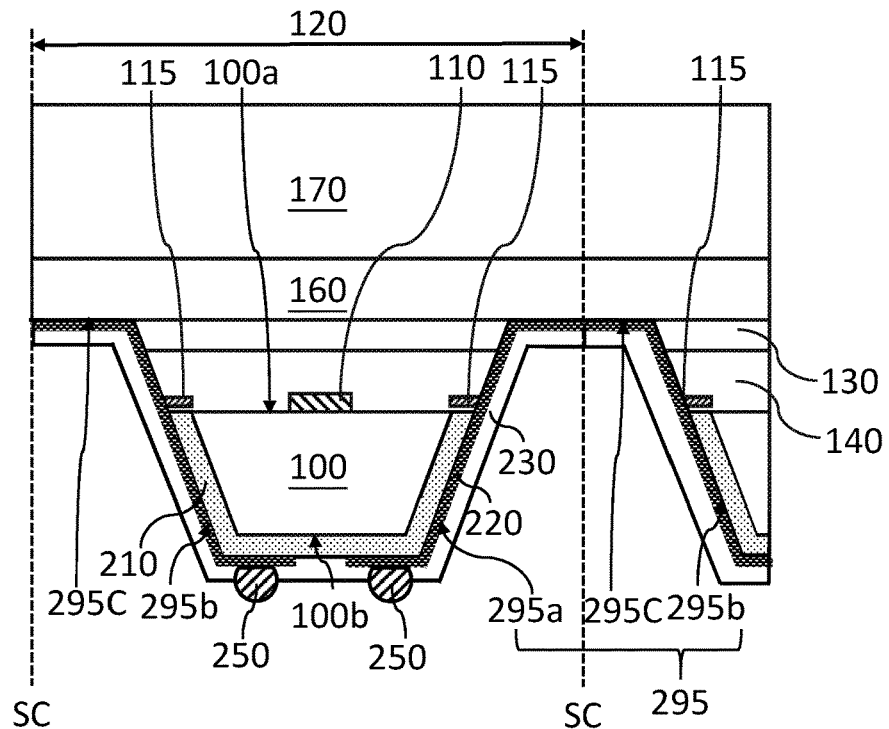

Next, referring to FIG. 5E, a patterned re-distribution layer (RDL) 220 is conformably formed on the insulating layer 210 by means of deposition processes (e.g. spin-coating, PVD, CVD, electroplating, electroless-deposition, or other suitable process), photolithography and etching processes. The RDL 220 conformably is extended onto the first sidewall 295a, the second sidewall 295b and the bottom wall 295c of each notch 295. The RDL 220 is separated from the sensing device wafer 210 by the insulating layer 210, and interconnected to the exposed edges of the conductive pads 115 on the first sidewall 295a and the second sidewall 295b. The RDL 220 comprises aluminum, copper, gold, platinum, nickel or combination thereof, or conductive polymers, conductive ceramic materials (e.g. ITO or IZO) or other suitable conductive materials.

Next, a passivation layer 230 is deposited to overlay the second bottom surface 100b of the sensing device wafer 100 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, a plurality of fifth through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the fifth through silicon vias (not shown) on the passivation 230 to electrically connect to the RDL 220. The conductive structures 250 is consisted of a material comprising tin, lead, copper, gold, nickel or combination thereof.

Figure 5F:
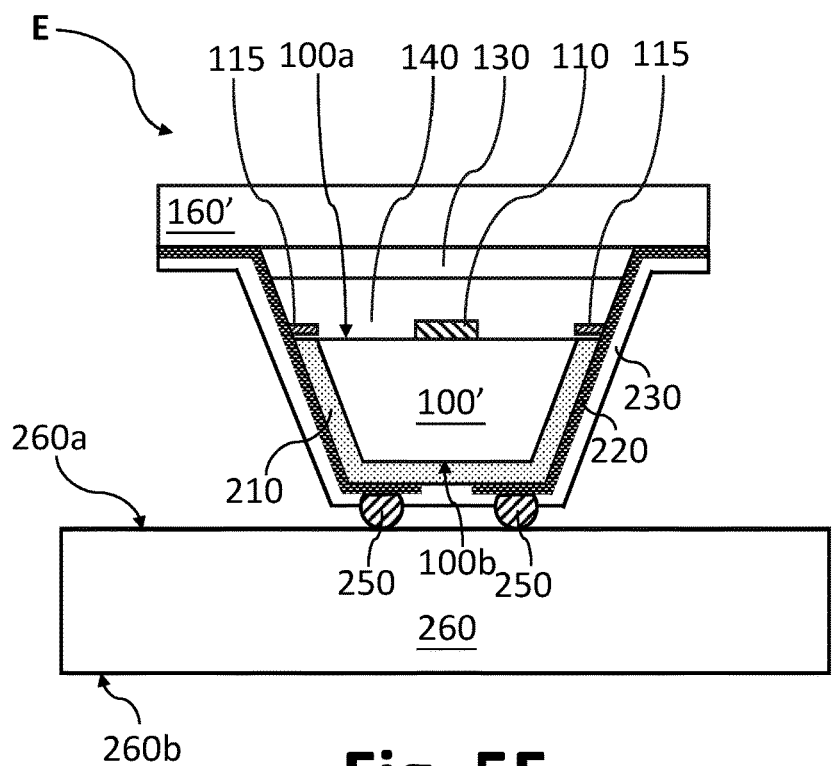

Next, please referring to FIG. 5F, a scribing process is applied along with the scribe channel (SC) to scribe the passivation 230, the RDL 220, the touch plate wafer 160 and the temporary substrate 170. Then, a plurality of chip scale sensing chip packages E are generated after removing the temporary substrate 170. Each chip scale sensing chip package E comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Finally, a circuit board 260 with a top surface 260a and a bottom surface 260b is provided. Then, the chip scale sensing chip package E is bounded to the top surface 260a of the circuit board 260, and electrically connected to the circuit board 260 through the conductive structures 250. For example, the chip scale sensing chip package E can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package E is bounded to the circuit board 260. Alternatively, abovementioned passive devices can be formed on the circuit board 260 together with the chip scale sensing chip package E during the same reflow process.

Exemplary Embodiment 6:

A detailed description of the chip scale sensing chip package and a method of manufacturing the same according to embodiment 6 of this invention is given below with reference to the accompanied FIGS. 6A~6F.

Figure 6A:
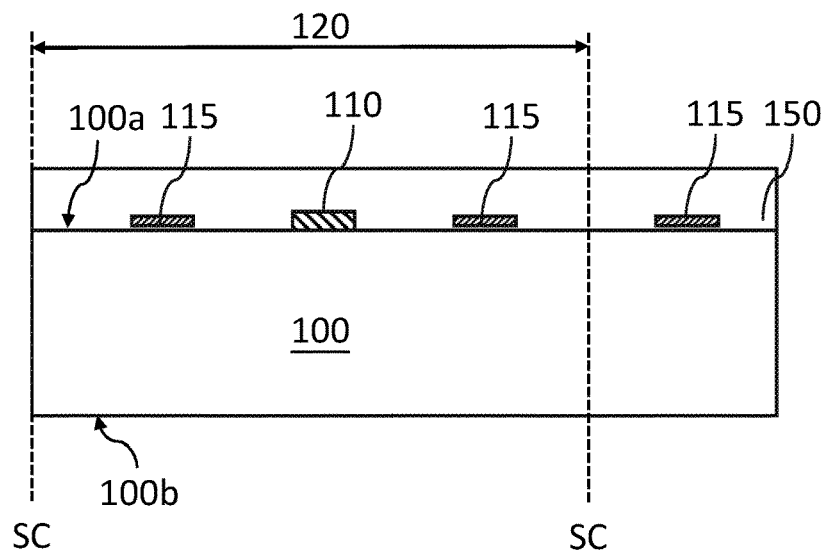
FIGS. 6A~6F are cross-sectional views of the exemplary embodiment 6 of a method of manufacturing a chip scale sensing chip package according to this present invention.

First, referring to FIG. 6A, a rectangle sensing device wafer 100 is provided, wherein the sensing device wafer 100 has a first top surface 100a and a first bottom surface 100b opposite to each other, and the sensing device wafer 100 comprises a plurality of chip areas 120. Each chip area 120 comprises a sensing device 110 nearby the first top surface 100a, and a plurality of conductive pads 115 nearby the first top surface 100a. Then, a color layer 150 comprising an adhesive consisted of a material selected from medium-K or low-K dielectric materials is formed for example by spin-coating on the first top surface 100a of the sensing device wafer 100.

Figure 6B:
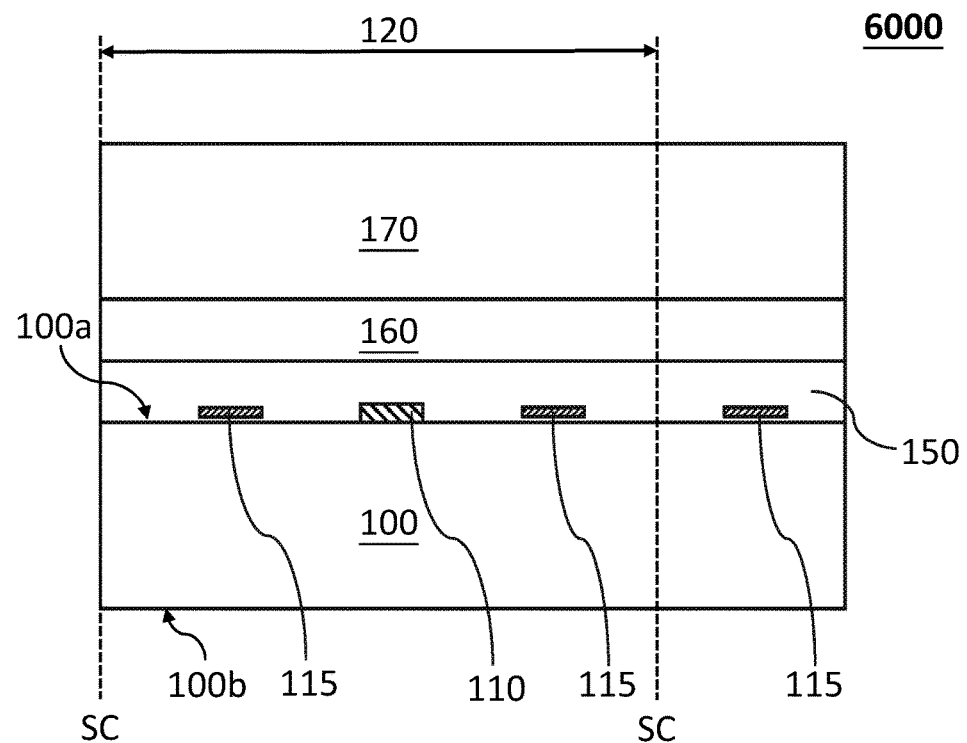

Next, referring to FIG. 6B, a rectangle touch plate wafer 160 with a thickness of about 100 μm is provided and placed on a temporary substrate 170 with a thickness of about 400 μm, wherein the touch plate wafer 160 comprises a plurality of touch area (not-shown), and each touch area corresponds to each chip area 120. Then, the touch plate wafer 160 is joined with the sensing device wafer 100 to form a stacking structure 6000. The touch plate wafer 160 is consisted of glass or other transparent materials with a hardness no less than 7, such as aluminum nitride, sapphire or ceramic materials.

Figure 6C:
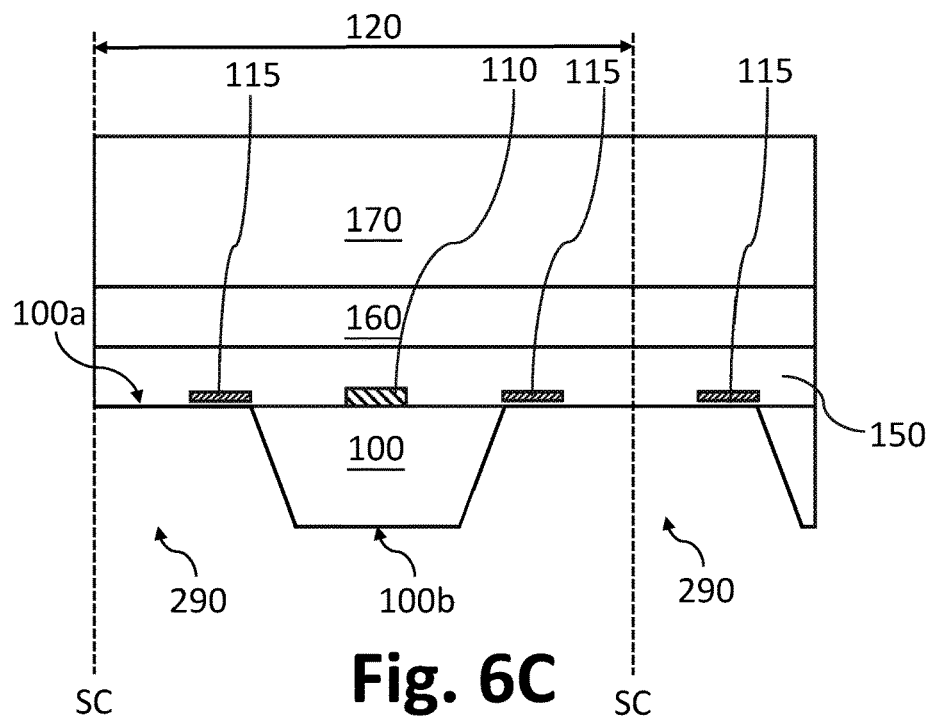

Next, referring to FIG. 6C, the first bottom surface 100b of the stacking structure 6000 is thinned by etching, milling, grinding or polishing to reduced its thickness till less than 100 μm. Then, the first bottom surface 100b within each of the chip regions 120 is processed by photolithography and etching process such as dry-etching, wet-etching, plasma-etching, reactive ions-etching or other suitable process to form a plurality of fourth through silicon vias 290 corresponding to the conductive pad 115.

Figure 6D:
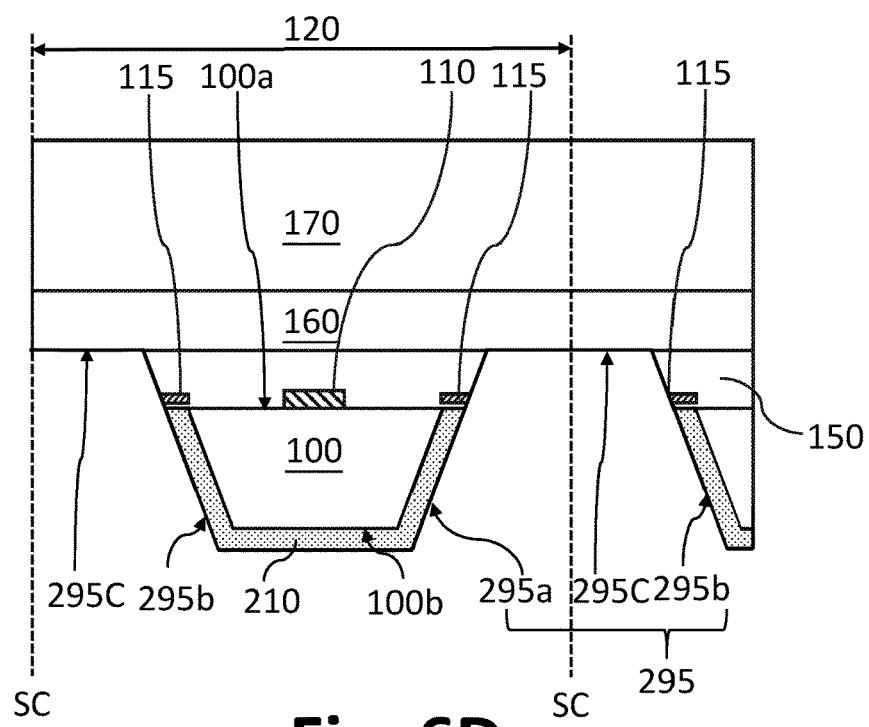

Next, referring to FIG. 6D, an insulating layer 210 is deposited to overlay the first bottom surface 100b of the wafer 100 and the fourth through silicon vias 290 by means of spin-coating, CVD, PVD or other suitable process. The insulating layer 210 of this present embodiment comprises epoxy resin, inorganic material (e.g. silicon oxide, silicon nitride, silicon oxynitride, metal oxide or combination thereof), organic polymer (e.g. polyimide, benzo cyclo butane, poly-p-xylene, naphthalene polymer, chlorofluorocarbons or acrylic ester) or other suitable materials.

Next, a plurality of notches 295 are formed by removing partial of the insulating layers 210 and the color layer 130, and partial of the conductive pads 115 nearby each of the fourth through holes 290, and partial of the color layer 150 comprising an adhesive by means of the so-called notching processes. Each notch 295 comprises a first side wall 295a, a second sidewall 295b and a bottom wall 295c adjoined therebetween, wherein both the first side wall 295a and the second sidewall 295b expose the edges of the conductive pads 115 thereon.

Figure 6E:
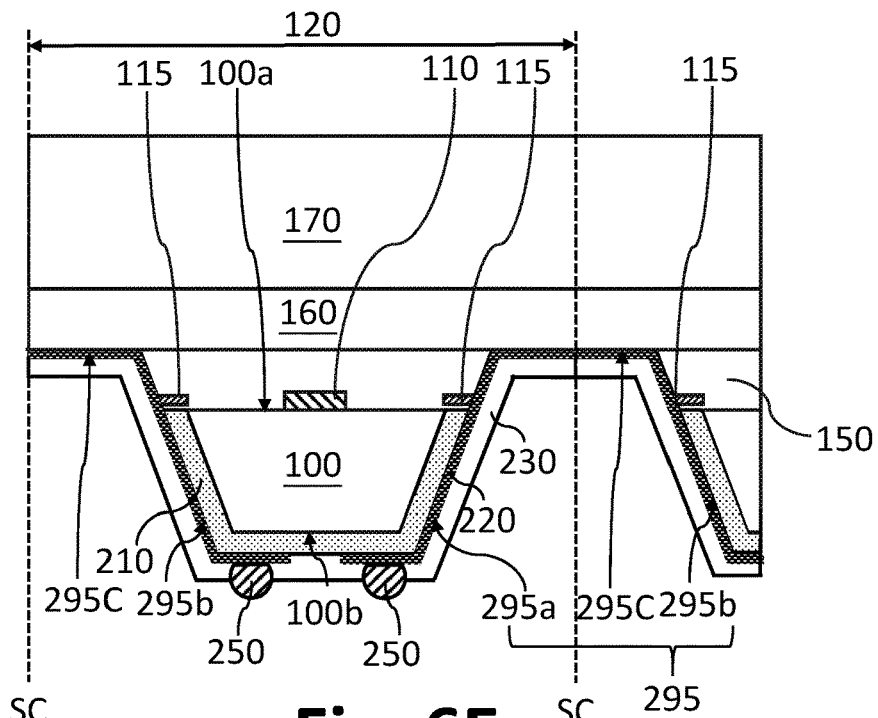

Next, referring to FIG. 6E, a patterned re-distribution layer (RDL) 220 is conformably formed on the insulating layer 210 by means of deposition processes (e.g. spin-coating, PVD, CVD, electroplating, electroless-deposition, or other suitable process), photolithography and etching processes. The RDL 220 conformably is extended onto the first sidewall 295a, the second sidewall 295b and the bottom wall 295c of each notch 295. The RDL 220 is separated from the sensing device wafer 210 by the insulating layer 210, and interconnected to the exposed edges of the conductive pads 115 on the first sidewall 295a and the second sidewall 295b. The RDL 220 comprises aluminum, copper, gold, platinum, nickel or combination thereof, or conductive polymers, conductive ceramic materials (e.g. ITO or IZO) or other suitable conductive materials.

Next, a passivation layer 230 is deposited to overlay the second bottom surface 100b of the sensing device wafer 100 and the RDL 220. The passivation layer 230 is consisted of a material comprising epoxy resin, solder mask, inorganic material (e.g. silicon oxide, silicon nitride, silicon oxynitride, metal oxide or combination thereof), organic polymer (e.g. polyimide, benzo cyclo-butane, poly-p-xylene, naphthalene polymer, chlorofluorocarbons or acrylic ester) or other suitable materials.

Next, a plurality of fifth through silicon vias (not shown) exposing part of the RDL 220 are formed on the passivation layer 230 above the first bottom substrate 100b of the sensing device wafer 100. Next, a plurality of conductive structures 250 (e.g. solder balls, solder bumps or conductive pills) are formed in the fifth through silicon vias (not shown) on the passivation 230 to electrically connect to the RDL 220. The conductive structures 250 is consisted of a material comprising tin, lead, copper, gold, nickel or combination thereof.

Figure 6F:
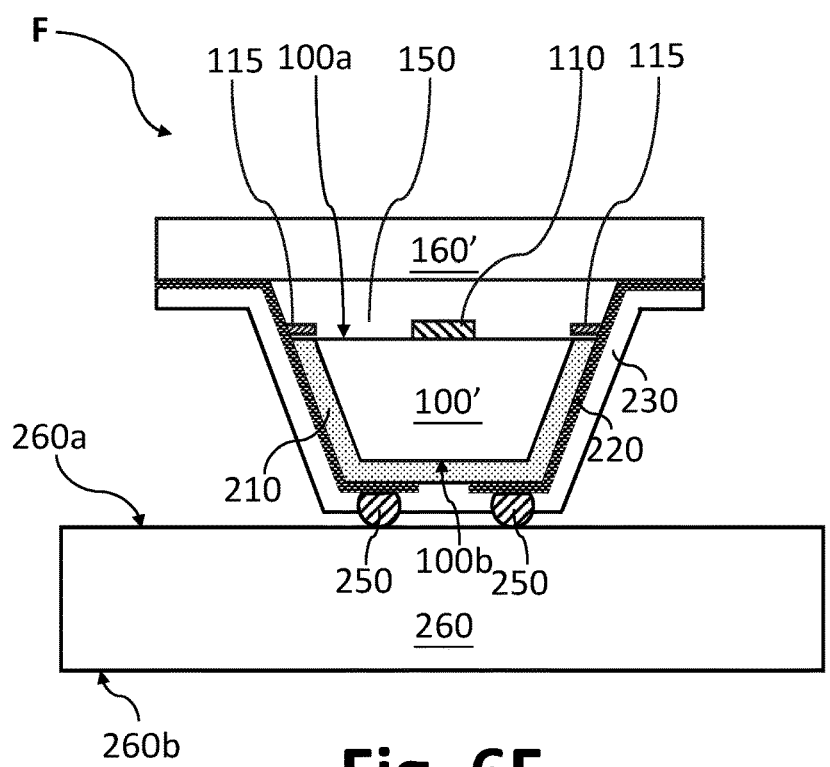

Next, please referring to FIG. 6F, a scribing process is applied along with the scribe channel (SC) to scribe the passivation 230, the RDL 220, the touch plate wafer 160 and the temporary substrate 170. Then, a plurality of chip scale sensing chip packages F are generated after removing the temporary substrate 170. Each chip scale sensing chip package F comprises a rectangle chip scale sensing chip 100' having a sensing device 110 and a plurality of conductive pads 115 adjacent to the sensing device 110 and a touch plate wafer 160' above the sensing chip 100', wherein top-viewing profiles of the touch plate wafer 160' and the sensing chip 100' are rectangular and of the same size.

Finally, a circuit board 260 with a top surface 260a and a bottom surface 260b is provided. Then, the chip scale sensing chip package F is bounded to the top surface 260a of the circuit board 260, and electrically connected to the circuit board 260 through the conductive structures 250. For example, the chip scale sensing chip package F can be bounded to the circuit board 260 through conductive structures 250 consisted of solder by a reflow process. Besides, passive devices such as inductors, capacitors, resistors or other electronic parts can be formed on the circuit board 260 by means of surface mount technology (SMT) before or after the chip scale sensing chip package F is bounded to the circuit board 260. Alternatively, abovementioned passive devices can be formed on the circuit board 260 together with the chip scale sensing chip package F during the same reflow process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip scale sensing chip package, comprising:
   a sensing chip, having a first top surface and a first bottom surface opposite to each other, comprising:
   a sensing device formed nearby the first top surface, and a plurality of conductive pads formed nearby the first top surface and adjacent to the sensing device;
   a plurality of through silicon vias formed on the first bottom surface, and each of the through silicon vias exposing its corresponding conductive pad;
   a plurality of conductive structures, formed on the first bottom surface; and
   a re-distribution layer, overlaying the first bottom surface and each through silicon via to electrically connect each conductive pad and each conductive structure;
   a touch plate having a second top surface and a second bottom surface opposite to each other, formed above the sensing chip;
   a color layer, sandwiched between the sensing chip and the touch plate; and
   an adhesive layer sandwiched between the sensing chip and the color layer, or mixed within the color layer.

2. The chip scale sensing chip package as claimed in claim 1, wherein the adhesive layer comprises a material consisting of medium-K or low-K dielectric materials.

3. The chip scale sensing chip package as claimed in claim 2, wherein the touch plate and the sensing chip are of the same size.

4. The chip scale sensing chip package as claimed in claim 3, wherein the top-viewing profiles of the touch plate and the sensing chip are rectangular.

5. The chip scale sensing chip package as claimed in claim 1, wherein the touch plate comprises a material selected from one or more members of the group consisted of glass, sapphire, aluminum nitride and ceramic materials.

6. The chip scale sensing chip package as claimed in claim 1, wherein the cross-sectional area of each through silicon via increases from the first top surface to the first bottom surface.

7. The chip scale sensing chip package as claimed in claim 1, wherein the conductive structures comprise solder balls, solder bumps or conductive pillars.

8. A method of manufacturing a chip scale sensing chip package, comprising the steps of:
   providing a sensing device wafer, having a first top surface and a first bottom surface opposite to each other, wherein the sensing chip wafer comprises a plurality of chip areas, and each chip area has a sensing device formed nearby the first top surface and a plurality of conductive pads formed nearby the first top surface and adjacent to the sensing device;
   providing a touch plate wafer with a plurality of touch plates areas, wherein each touch plate area corresponds to each sensing chip area, and each touch plate has a second top surface and a second bottom surface opposite to each other;
   spin-coating a color layer on the first top surface of the sensing device wafer or the second bottom surface of the touch plate wafer;
   forming an adhesive layer sandwiched between the sensing device wafer and the color layer, or mixed within the color layer;
   joining the sensing device wafer with the touch plate wafer to form a stacking structure, wherein the color layer is sandwiched between the sensing device wafer and the touch plate wafer;
   thinning the first bottom surface of the sensing device wafer;

forming a plurality of first through silicon vias on the first bottom surface, wherein each first through silicon via corresponds to each conductive pad;

forming an insulating layer on the first bottom surface, the side wall and the bottom wall of each first through silicon via, wherein the insulating layer has a plurality of second through silicon vias expose the conductive pads, and each second through silicon via runs through each first through silicon via;

forming a re-distributed layer on the insulating layer to electrically connect to each conductive pad through each second through silicon via;

forming a passivation layer on the re-distributed layer, wherein the passivation layer has a plurality of third through silicon vias exposing the re-distributed layer;

forming a plurality of conductive structures in the third through silicon vias, and electrically connecting the conductive structures to the re-distributed layer; and scribing the chip areas and the touch plate areas corresponding to the chip areas to generate a plurality of individual chip scale sensing chip packages.

9. The method of manufacturing a chip scale sensing chip package as claimed in claim 8, wherein the adhesive layer comprises a material consisted of medium-K or low-K dielectric materials.

10. The method of manufacturing a chip scale sensing chip package as claimed in claim 9, wherein the touch plate and the sensing chip are of the same size.

11. The method of manufacturing a chip scale sensing chip package as claimed in claim 10, wherein the top-viewing profiles of the touch plate and the sensing chip are rectangular.

12. The method of manufacturing a chip scale sensing chip package as claimed in claim 8, wherein the touch plate comprises the material selected from one or more members of the group consisted of glass, sapphire, aluminum nitride and ceramic materials.

13. The method of manufacturing a chip scale sensing chip package as claimed in claim 8, wherein the cross-sectional area of each first through silicon via increases from the first top surface to the first bottom surface.

14. The method of manufacturing a chip scale sensing chip package as claimed in claim 8, wherein the conductive structures comprise solder balls, solder bumps or conductive pillars.

15. The method of manufacturing a chip scale sensing chip package as claimed in claim 8, the touch plate wafer is formed on a temporary substrate, and the temporary is removed after the step of scribing to generate a plurality of individual chip scale sensing chip packages.

16. A chip scale sensing chip package, comprising:
a sensing chip, having a first top surface, an opposite first bottom surface, and a first sidewall and a second sidewall respectively adjoined to the first top surface and the first bottom surface, comprising:
a sensing device formed nearby the first top surface, and a plurality of conductive pads formed nearby the first top surface and adjacent to the sensing device, wherein the first side wall and the second side wall respectively exposes the edge of each conductive pad;
a plurality of conductive structures, formed on the first bottom surface; and
a re-distribution layer, overlay the first bottom surface, the first side wall and the second side wall to electrically connect each conductive pad and each conductive structure;

a touch plate having a second top surface and a second bottom surface opposite to each other, formed above the sensing chip;
a color layer, sandwiched between the sensing chip and the touch plate; and
an adhesive layer sandwiched between the sensing chip and the color layer, or mixed within the color layer.

17. The chip scale sensing chip package as claimed in claim 16, wherein the adhesive layer comprises a material consisting of medium-K or low-K dielectric materials.

18. The chip scale sensing chip package as claimed in claim 17, wherein the touch plate and the sensing chip are of the same size.

19. The chip scale sensing chip package as claimed in claim 18, wherein the top-viewing profiles of the touch plate and the sensing chip are rectangular.

20. The chip scale sensing chip package as claimed in claim 16, wherein the touch plate comprises a material selected from one or more members of the group consisted of glass, sapphire, aluminum nitride and ceramic materials.

21. The chip scale sensing chip package as claimed in claim 16, wherein the conductive structures comprise solder balls, solder bumps or conductive pillars.

22. A method of manufacturing a chip scale sensing chip package, comprising the steps of:
providing a sensing device wafer, having a first top surface and a first bottom surface opposite to each other, wherein the sensing chip wafer comprises a plurality of chip areas, and each chip area has a sensing device formed nearby the first top surface and a plurality of conductive pads formed nearby the first top surface and adjacent to the sensing device;
providing a touch plate wafer with a plurality of touch plates areas, wherein each touch plate area corresponds to each sensing chip area, and each touch plate has a second top surface and a second bottom surface opposite to each other;
spin-coating a color layer on the first top surface of the sensing device wafer or on the second bottom surface of the touch plate wafer;
forming an adhesive layer sandwiched between the sensing device wafer and the color layer, or mixed within the color layer;
joining the sensing device wafer with the touch plate wafer to form a stacking structure, wherein the color layer is sandwiched between the sensing device wafer and the touch plate wafer;
thinning the first bottom surface of the sensing device wafer;
forming a plurality of fourth through silicon vias on the first bottom surface, wherein each fourth through silicon via corresponds to each conductive pad;
forming an insulating layer on the first bottom surface and the fourth through silicon vias;
removing the insulating layer adjacent to the fourth through silicon vias, part of the color layer and part of the conductive pads to form a plurality of notches, wherein each notch has a bottom wall, a first side wall and a second wall extended upward from the edges of the bottom wall of each notch, and each first side wall and each second wall exposes the edge of each conductive pad;
forming a re-distributed layer on the insulating layer and overlaying the first side wall, the second side wall and the bottom to electrically connect to the exposed edge of each conductive pad on the first side wall and the second side wall;

forming a passivation layer on the re-distributed layer, wherein the passivation has a plurality of fifth through silicon vias exposing the re-distributed layer;

forming a plurality of conductive structures in the fifth through silicon vias, and electrically connected to the re-distributed layer; and scribing the chip areas and the touch plate areas corresponding to the chip areas to generate a plurality of individual chip scale sensing chip package.

23. The method of manufacturing a chip scale sensing chip package as claimed in claim 22, wherein the adhesive layer comprises a material consisted of medium-K or low-K dielectric materials.

24. The method of manufacturing a chip scale sensing chip package as claimed in claim 23, wherein the touch plate and the sensing chip are of the same size.

25. The method of manufacturing a chip scale sensing chip package as claimed in claim 24, wherein the top-viewing profiles of the touch plate and the sensing chip are rectangular.

26. The method of manufacturing a chip scale sensing chip package as claimed in claim 22, wherein the touch plate comprises a material selected from one or more members of the group consisted of glass, sapphire, aluminum nitride and ceramic materials.

27. The method of manufacturing a chip scale sensing chip package as claimed in claim 22, wherein the conductive structures comprise solder balls, solder bumps or conductive pillars.

28. The method of manufacturing a chip scale sensing chip package as claimed in claim 22, the touch plate wafer is formed on a temporary substrate, and the temporary is removed after the step of scribing to generate a plurality of individual chip scale sensing chip packages.

* * * * *